(12) United States Patent
Moon et al.

(10) Patent No.: US 12,453,132 B2
(45) Date of Patent: Oct. 21, 2025

(54) THIN FILM TRANSISTOR ARRAY, FABRICATION METHOD THEREOF, AND DISPLAY APPARATUS COMPRISING THE THIN FILM TRANSISTOR ARRAY

(71) Applicant: LG Display Co., Ltd., Seoul (KR)

(72) Inventors: KyeongJu Moon, Paju-si (KR); SoYoung Noh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 490 days.

(21) Appl. No.: 17/901,702

(22) Filed: Sep. 1, 2022

(65) Prior Publication Data

US 2023/0073848 A1   Mar. 9, 2023

(30) Foreign Application Priority Data

Sep. 3, 2021  (KR) .......................... 10-2021-0117838
Dec. 31, 2021  (KR) .......................... 10-2021-0194810

(51) Int. Cl.
*H10D 30/67*  (2025.01)
*H10D 30/01*  (2025.01)
*H10K 59/121*  (2023.01)

(52) U.S. Cl.
CPC ....... *H10D 30/6755* (2025.01); *H10D 30/031* (2025.01); *H10D 30/6757* (2025.01); *H10K 59/1213* (2023.02)

(58) Field of Classification Search
CPC ............. H10D 30/6755; H10D 30/031; H10D 30/6757; H10D 30/6719; H10D 86/0221;
(Continued)

(56) References Cited

U.S. PATENT DOCUMENTS 8,227,845 B2 *  7/2012  Shin .................... H10K 59/1213
                                                        257/292
9,219,158 B2 * 12/2015  Miyairi .............. H10D 30/6733
(Continued)

FOREIGN PATENT DOCUMENTS

JP      2009-099888 A    5/2009
KR  10-2014-0088635 A    7/2004
KR  10-2021-0035694 A    4/2021

OTHER PUBLICATIONS

Korean Intellectual Property Office, Office Action, Korean Patent Application No. 10-2021-0194810, Sep. 17, 2025, 17 pages.

*Primary Examiner* — Tan N Tran
(74) *Attorney, Agent, or Firm* — Fenwick & West LLP

(57) ABSTRACT

Disclosed is a thin film transistor array comprising a substrate, a first thin film transistor on the substrate, and a second thin film transistor on the substrate, wherein the first thin film transistor includes a first active layer including an oxide semiconductor on the substrate, the first active layer includes a first channel portion, a first conductor portion, and a first middle portion between the first channel portion and the first conductor portion, the second thin film transistor includes a second active layer including an oxide semiconductor on the substrate, the second active layer includes a second channel portion, a second conductor portion, and a second middle portion between the second channel portion and the second conductor portion, and resistivity of the first conductor portion of the first thin film transistor is greater than resistivity of the second conductor portion of the second thin film transistor.

13 Claims, 19 Drawing Sheets

(58) Field of Classification Search
CPC ... H10D 86/423; H10D 86/60; H10K 59/1213
See application file for complete search history.

(56) References Cited

U.S. PATENT DOCUMENTS 10,763,372 B2 * 9/2020 Miyairi .................. H10D 62/80
2009/0104737 A1   4/2009 Sato et al.

* cited by examiner

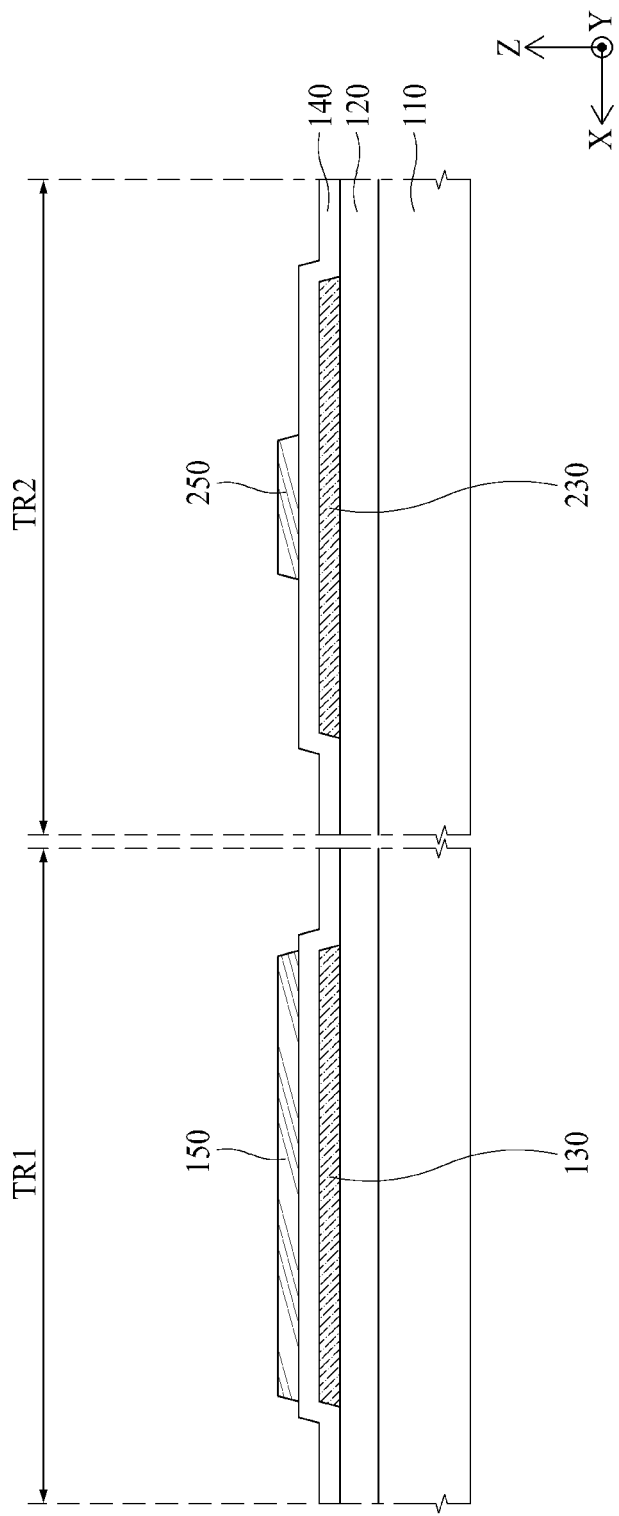

THIN FILM TRANSISTOR ARRAY, FABRICATION METHOD THEREOF, AND DISPLAY APPARATUS COMPRISING THE THIN FILM TRANSISTOR ARRAY

CROSS-REFERENCE TO RELATED APPLICATIONS

This application claims the benefit of the Republic of Korea Patent Application No. 10-2021-0117838 filed on Sep. 3, 2021 and the Republic of Korea Patent Application No. 10-2021-0194810 filed on Dec. 31, 2021, each of which is hereby incorporated by reference in its entirety.

BACKGROUND

Technical Field

The present disclosure relates to a thin film transistor array, a fabrication method thereof, and a display apparatus comprising the thin film transistor array.

Description of the Related Art

According to a material constituting an active layer, a thin film transistor may be divided into an amorphous silicon thin film transistor using an active layer of amorphous silicon, a polycrystalline silicon thin film transistor using as an active layer of polycrystalline silicon, and an oxide semiconductor thin film transistor using as an active layer of oxide semiconductor.

Since the oxide semiconductor thin film transistor TFT has a large resistance change based on the content of oxygen, it facilitates obtaining the desired physical properties. Also, since the oxide constituting the active layer becomes a thin film at a relatively low temperature for a fabrication process of the oxide semiconductor thin film transistor, a fabrication cost is low. The oxide semiconductor is transparent owing to the properties of the oxide, whereby it is favorable to a realization of a transparent display apparatus.

In case of a coplanar transistor having a top gate structure stacked on the same plane by the same process, a conductor portion resistance and a middle portion length of an active layer are the same. Accordingly, it is difficult to improve electrical characteristics such as mobility and on-current and to reduce short channel effects generated in a thin film transistor having a short channel length such as a hot carrier stress HCS and a threshold voltage roll-off phenomenon.

SUMMARY

The present disclosure recognizes the above-mentioned problems and various experiments were made to improve electrical characteristics such as mobility and on-current and to reduce short channel effects generated in a thin film transistor having a short channel length such as a hot carrier stress HCS and a threshold voltage roll-off phenomenon. On the basis of results of the various experiments, a thin film transistor array is disclosed that is capable of reducing short channel effects generated in a thin film transistor having a short channel length such as a hot carrier stress HCS and a threshold voltage roll-off phenomenon, and adjusting mobility and on-current with easiness, a display apparatus comprising the thin film transistor array, and a fabrication method of the thin film transistor array.

The present disclosure has been made in view of the above problems, and it is an object of the present disclosure to provide a thin film transistor array in which conductor portions of a plurality of transistors provided on the same plan have different resistances, a display apparatus comprising the thin film transistor array, and a fabrication method of the thin film transistor array.

It is another object of the present disclosure to provide a thin film transistor array capable of reducing short channel effects generated in a thin film transistor having a short channel length such as a hot carrier stress HCS, a threshold voltage roll-off phenomenon, and a threshold voltage required in an individual thin film transistor for a plurality of thin film transistors provided on the same plan, and optimizing the electrical characteristics such as mobility and on-current, a display apparatus comprising the thin film transistor array, and a fabrication method of the thin film transistor array.

It is another object of the present disclosure to provide a thin film transistor array in which active layers of a plurality of transistors provided on the same plan have different dopant concentrations, a display apparatus comprising the thin film transistor array, and a fabrication method of the thin film transistor array.

In one embodiment, a thin film transistor array comprises: a substrate; a first thin film transistor on the substrate, the first thin film transistor including a first active layer on the substrate comprising a first oxide semiconductor, a first channel portion, a first conductor portion, and a first middle portion between the first channel portion and the first conductor portion; and a second thin film transistor on the substrate, the second thin film transistor including a second active layer on the substrate comprising a second oxide semiconductor, a second channel portion, a second conductor portion, and a second middle portion between the second channel portion and the second conductor portion, wherein a resistivity of the first conductor portion of the first thin film transistor is greater than a resistivity of the second conductor portion of the second thin film transistor.

In one embodiment, a thin film transistor array comprises: a substrate; a first oxide semiconductor thin film transistor on the substrate, the first oxide semiconductor thin film transistor including a first active layer having a first channel portion, a first conductor portion, and a first middle portion between the first channel portion and the first conductor portion; and a second oxide semiconductor thin film transistor on the substrate, the second oxide thin film transistor including a second active layer having a second channel portion, a second conductor portion, and a second middle portion between the second channel portion and the second conductor portion, wherein a length of the first channel portion of the first oxide semiconductor thin film transistor is greater than a length of the second channel portion of the second oxide semiconductor thin film transistor, and a length of the first middle portion of the first oxide semiconductor thin film transistor is less than a length of the second middle portion of the second oxide semiconductor thin film transistor.

In one embodiment, a fabrication method a thin film transistor array including a first thin film transistor and a second thin film transistor on a substrate comprising: forming a first active layer of the first thin transistor and a second active layer of the second thin transistor on the substrate, the second active layer spaced apart from the first active layer; forming a gate insulating film on the first active layer and the second active layer; forming a first gate electrode on the first active layer such that the first gate electrode overlaps a first end of the first active layer and a second end of the first active layer that is opposite the first end of the first active layer; forming a second gate electrode that overlaps a portion of the second active layer without overlapping a first end of the second active layer and a second end of the active layer that is opposite the first end of the second active layer; performing a first doping on the first active layer and the second active layer with a dopant, the first gate electrode configured as a first mask such that the first active layer is not doped with the dopant, and the second gate electrode configured as a second mask such that at least the first end of the second active layer and the second end of the active layer are doped with the dopant; patterning the first gate electrode such that the first end of the first active layer and the second end of the first active layer are non-overlapping with the patterned first gate electrode; and performing a second doping on the first active layer and the second active layer with the dopant, the patterned first gate electrode configured as a third mask such that the first end of the first active layer and the second end of the first active layer are doped with the dopant, and the second gate electrode configured as the second mask such that at least the first end of the second active layer and the second end of the active layer are again doped with the dopant.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other objects, features and other advantages of the present disclosure will be more clearly understood from the following detailed description taken in conjunction with the accompanying drawings, in which:

FIGS. 9A to 9F illustrate a fabrication method of the thin film transistor array according to one embodiment of the present disclosure;

DETAILED DESCRIPTION

Figure 1:
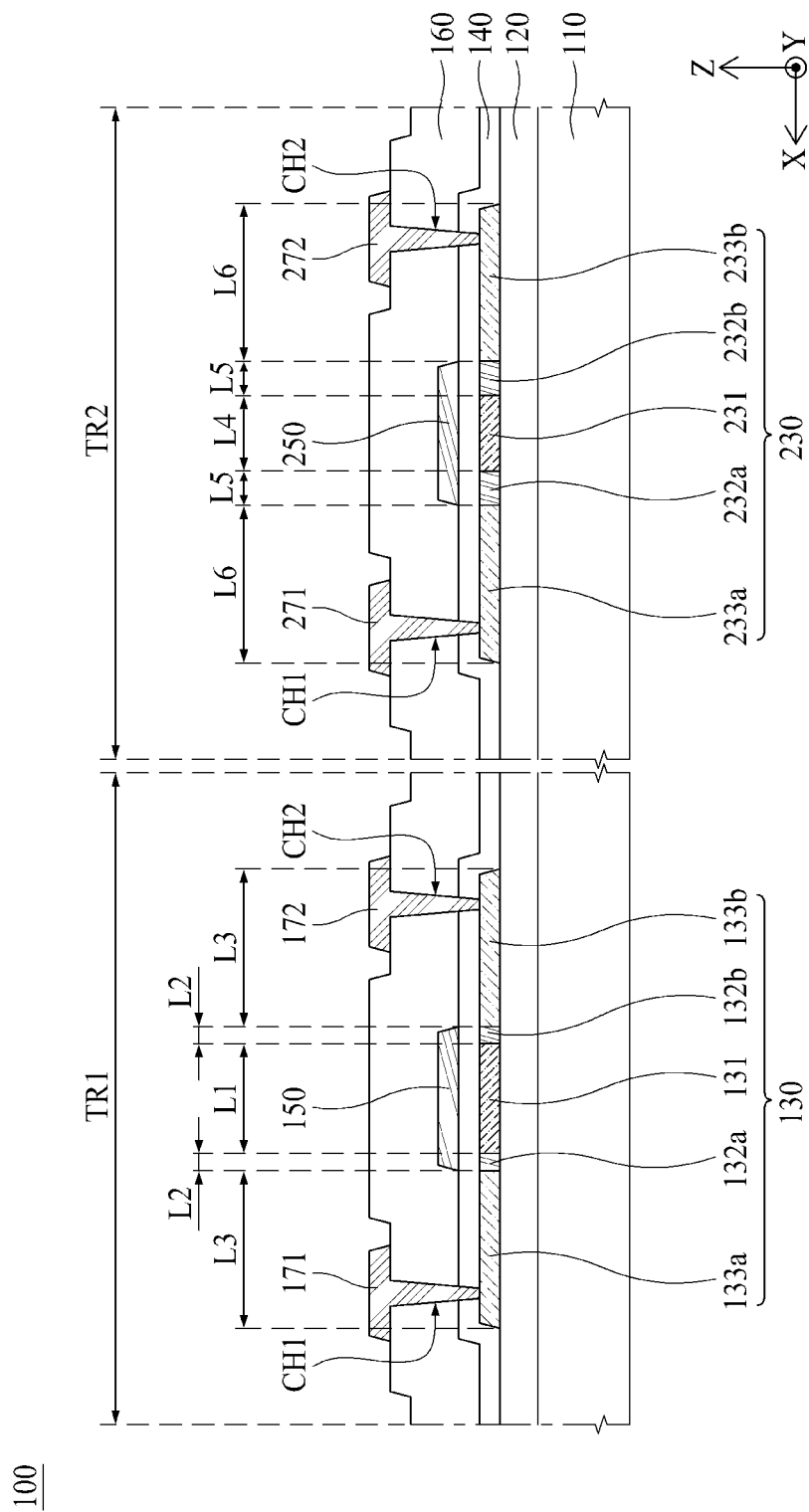
FIG. 1 is a cross sectional view of a thin film transistor array according to an embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

Figure 2:
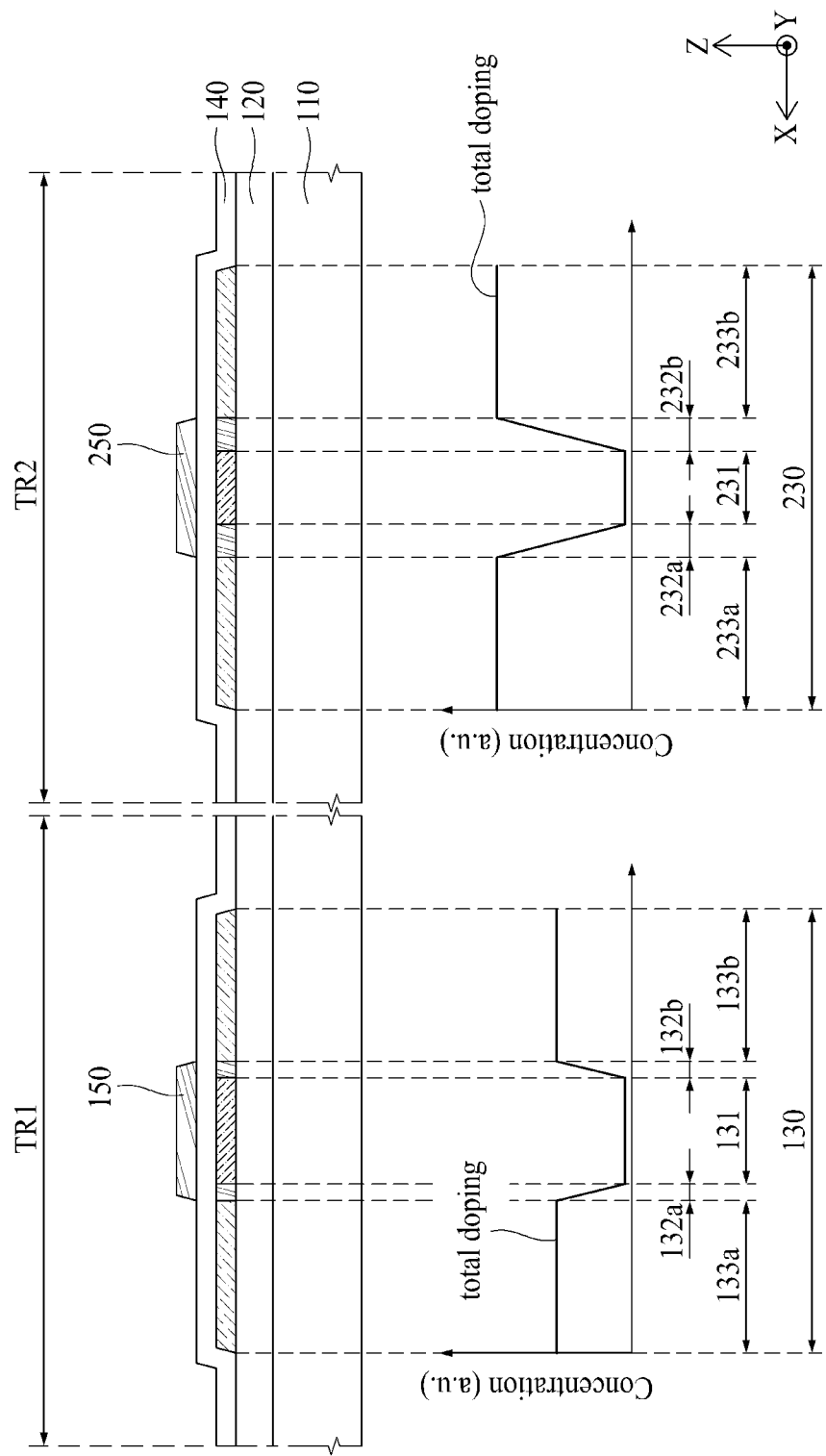
FIG. 2 illustrates a dopant concentration of an active layer in a first thin film transistor and a dopant concentration of an active layer of a second thin film transistor in the thin film transistor array according to the embodiment of the present disclosure.

FIG. 1 is a cross sectional view of a thin film transistor array according to an embodiment of the present disclosure. FIG. 2 illustrates a dopant concentration of an active layer of a first thin film transistor and a dopant concentration of an active layer of a second thin film transistor in the thin film transistor array according to the embodiment of the present disclosure. FIG. 2 illustrates a relative dopant concentration at a horizontal direction or a first direction X in the active layer of each of the first thin film transistor and the second thin film transistor.

Figure 7:
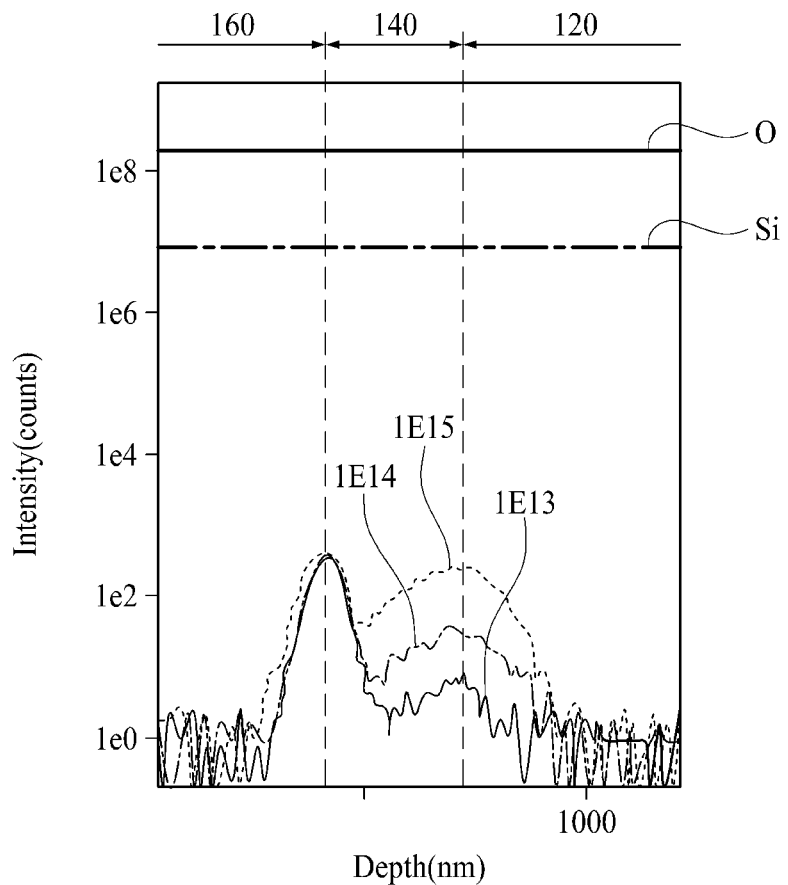
FIG. 7 is a graph of a dopant concentration according to a depth of dopant doping set in various conditions according to one embodiment of the present disclosure.

The concentration of the dopant in the present disclosure is the relative concentration of a lateral or horizontal direction of the active layer, except for a description of FIG. 7, which will be described later. Also, the concentration of the dopant in FIG. 7 is a concentration profile for a depth direction or a third direction Z of the thin film transistor.

Referring to FIGS. 1 and 2, the thin film transistor array 100 according to the embodiment of the present disclosure includes a substrate 110, a first thin film transistor TR1 on the substrate 110, and a second thin film transistor TR2 on the substrate 110.

The first thin film transistor TR1 includes an active layer 130 including an oxide semiconductor, a gate electrode 150 provided on the active layer 130 and spaced apart from the active layer 130, and a gate insulating film 140 between the active layer 130 and the gate electrode 150.

The second thin film transistor TR2 includes an active layer 230 including an oxide semiconductor, a gate electrode 250 provided on the active layer 230 and spaced apart from the active layer 230, and the gate insulating film 140 between the active layer 230 and the gate electrode 250.

Hereinafter, referring to FIGS. 1 and 2, the thin film transistor array 100 according to one embodiment of the present disclosure will be described in detail.

The substrate 110 may be a glass substrate, a curable or bendable thin film glass substrate, a plastic substrate, or a silicon wafer substrate. If using plastic for the substrate 110, transparent plastic having flexibility, for example, polyimide may be used. If the substrate 110 is formed of polyimide, heat resistant polyimide capable of enduring a high temperature may be used in consideration of a high temperature deposition process on the substrate 110.

A buffer layer 120 may be disposed on the substrate 110. The buffer layer 120 may be commonly disposed under the first thin film transistor TR1 and the second thin film transistor TR2. The buffer layer 120 may be formed of a multi-layer by stacking one or more inorganic films of a silicon oxide film SiOx, a silicon nitride layer SiN, and a silicon oxynitride layer SiON.

The active layer 130 of the first thin film transistor TR1 may be disposed on the buffer layer 120.

The active layer 130 of the first thin film transistor TR1 may overlap the first gate electrode 150, and first and second electrodes 171 and 172. The active layer 130 of the first thin film transistor TR1 includes a channel portion 131, a first conductor portion 133a, and a second conductor portion 133b. The first conductor portion 133a is disposed at one side (e.g., a first side) of the channel portion 131, and the second conductor portion 133b is disposed at another side (e.g., a second side) of the channel portion 131. The first conductor portion 133a and the second conductor portion 133b of the first thin film transistor TR1 may be defined as the active layer 130 which is non-overlapping with the gate electrode 150.

The active layer 230 of the second thin film transistor TR2 may overlap the second gate electrode 250, and first and second electrodes 271 and 272. The active layer 230 of the second thin film transistor TR2 includes a channel portion 231, a first conductor portion 233a, and a second conductor portion 233b. The first conductor portion 233a is disposed at one side (e.g., a first side) of the channel portion 231, and the second conductor portion 233b is disposed at another side (e.g., a second side) of the channel portion 231. The first conductor portion 233a and the second conductor portion 233b of the second thin film transistor TR2 may be defined as the active layer 230 which is non-overlapping with the gate electrode 250.

The active layer 130 of the first thin film transistor TR1 and the active layer 230 of the second thin film transistor TR2 may include at least one of oxide semiconductor materials, for example, IZO(InZnO)-based oxide semiconductor, IGO(InGaO)-based oxide semiconductor, ITO(InSnO)-based oxide semiconductor, IGZO(InGaZnO)-based oxide semiconductor, IGZTO(InGaZnSnO)-based oxide semiconductor, ITZO(InSnZnO)-based oxide semiconductor, IGTO(InGaSnO)-based oxide semiconductor, GO(GaO)-based oxide semiconductor, GZTO(GaZnSnO)-based oxide semiconductor, and GZO(GaZnO)-based oxide semiconductor. However, one embodiment of the present disclosure is not limited thereto, and the active layer may be formed by other oxide semiconductor materials generally known to those in the art.

Also, the active layer 130 of the first thin film transistor TR1 further includes a first middle portion 132a between the channel portion 131 and the first conductor portion 133a, and a second middle portion 132b between the channel portion 131 and the second conductor portion 133b.

The active layer 230 of the second thin film transistor TR2 further includes a first middle portion 232a between the channel portion 231 and the first conductor portion 233a, and a second middle portion 232b between the channel portion 231 and the second conductor portion 233b. The first middle portions 132a and 232a and the second middle portions 132b and 232b of the present disclosure may be referred to as lightly doped drain LDD regions, but not limited thereto. For example, a dopant concentration in first middle portion 132a and the second middle portion 132b of the first thin film transistor TR1, and the first middle portion 232a and the second middle portion 232b of the second thin film transistor TR2 may vary from a first side to a second side in a first direction X. Specifically, the first and second middle portions 132a and 132b have a dopant concentration that increases along a direction from the channel portion 131 toward the first and second conductor portions 133a and 133b, and the dopant concentration of the first middle portion 132a and the second middle portion 132b of the first thin film transistor TR1 reduces closer to the channel portion 131. The dopant concentration in the first middle portion 232a and the second middle portion 232b of the second thin film transistor TR2 reduces as it becomes closer to the channel portion 231.

The channel portion 131 of the first thin film transistor TR1 may have a first length L1, each of the first middle portion 132a and the second middle portion 132b may have a second length L2, and each of the first conductor portion 133a and the second conductor portion 133b may have a third length L3. The sum of the first length L1 and the second length L2 of the active layer 130 of the first thin film transistor TR1 may be the same as the length of the gate electrode 150 in the first direction X. The third length L3 of the active layer 130 of the first thin film transistor TR1 may be different from the length of the channel portion 131, the first middle portion 132a, and the second middle portion 132b in the first direction X length of the active layer 130.

The channel portion 231 of the second thin film transistor TR2 may have a fourth length L4, each of the first middle portion 232a and the second middle portion 232b may have a fifth length L5, and each of the first conductor portion 233a and the second conductor portion 233b may have a sixth length L6. The sum of the fourth length L4 and the fifth length L5 of the active layer 230 of the second thin film transistor TR2 may be the same as the length of the gate electrode 250 in the first direction X. The sixth length L6 of the active layer 230 of the second thin film transistor TR2 may be different from the length of the channel portion 231, the first middle portion 232a, and the second middle portion 232b in the first direction X length of the active layer 230.

According to one embodiment of the present disclosure, the dopant concentration of the first and second conductor portions 133a and 133b of the first thin film transistor TR1 may be less than the dopant concentration of the first and second conductor portions 233a and 233b of the second thin film transistor TR2.

Herein, the dopant concentration means the total doping concentration of dopant performed by a first dopant doping and a second dopant doping of FIGS. 3 and 4, which will be described later. Therefore, resistivity of the first and second conductor portions 133a and 133b of the first thin film transistor TR1 may be greater than resistivity of the first and second conductor portions 233a and 233b of the second thin film transistor TR2.

Also, according to one embodiment of the present disclosure, the second length L2 of the first and second middle portions 132a and 132b of the first thin film transistor TR1 may be less than the fifth length L5 of the first and second middle portions 232a and 232b of the second thin film transistor TR2. By the dopant doping and diffusion of the first and second conductor portions 133a and 133b shown in FIGS. 2 to 5, which will be described later, if the first and second conductor portions 133a and 133b of the first thin film transistor TR1 are lightly doped with the dopant in comparison to the first and second conductor portions 233a and 233b of the second thin film transistor TR2, the first direction X length of the first and second middle portions 132a and 132b of the first thin film transistor TR1 may be less than the first direction X length of the first and second middle portions 232a and 232b of the second thin film transistor TR2.

According to one embodiment of the present disclosure, the distance of dopant diffusion from the first and second conductor portions 133a and 133b of the first thin film transistor TR1 to the first and second middle portions 132a and 132b may be proportional to the initial concentration of dopant doped in the first and second conductor portions 133a and 133b. The distance of dopant diffusion from the first and second conductor portions 233a and 233b of the second thin film transistor TR2 to the first and second middle portions 232a and 232b may be proportional to the initial concentration of dopant doped in the first and second conductor portions 233a and 233b.

Accordingly, the first thin film transistor TR1 may have the length of the first and second middle portions 132a and 132b that is shorter than that of the second thin film transistor TR2.

When the structure of the first thin film transistor TR1 is applied to a thin film transistor of a short channel length having a short gate length, the first thin film transistor TR1 has a relatively high resistance in the first and second conductor portions 133a and 133b, a relatively short length in the first and second middle portions 132a and 132b, and a relatively long length in the channel portion 131, thereby reducing a short channel effect generated in the thin film transistor having the short channel length, for example, hot carrier stress HCS and threshold voltage roll-off phenomenon.

Also, when hydrogen is diffused to an oxide semiconductor layer, carrier in the oxide semiconductor layer is oversized, and thus, a threshold voltage changes in a negative direction so that stability of negative bias temperature stress NBTS may be weakened due to a negative voltage. The first and second conductor portions 133a and 133b of the first thin film transistor TR1 may be formed to have the relatively high resistivity as compared to the first and second conductor portions 233a and 233b of the second thin film transistor TR2 and may be formed to have the relatively low doping concentration as compared to the first and second conductor portions 233a and 233b of the second thin film transistor TR2. In addition, since the difference in the dopant concentration of the first and second conductor portions 133a and 133b and the channel portion 131 is small in the first thin film transistor TR1, sensitivity of the electrical characteristic change of the first thin film transistor TR1 with respect to the hydrogen diffusion may be low, and the influence by the negative bias temperature stress NBTS according to the negative voltage by the hydrogen diffusion, for example, the change in the electrical characteristics of the threshold voltage Vth may be reduced.

According to the embodiment of the present disclosure, the dopant concentration of the first and second conductor portions 133a and 133b of the first thin film transistor TR1 may be less than the dopant concentration of the first and second conductor portions 233a and 233b of the second thin film transistor TR2. Herein, the dopant concentration means the total doping concentration of the dopant by the first dopant doping and the second dopant doping of FIGS. 3 and 4, which will be described later. Accordingly, resistance of the first and second conductor portions 233a and 233b of the second thin film transistor TR2 may be less than resistance of the first and second conductor portions 133a and 133b of the first thin film transistor TR1.

Also, according to the embodiment of the present disclosure, the fifth length L5 of the first and second middle portions 232a and 232b of the second thin film transistor TR2 may be greater than the second length L2 of the first and second middle portions 132a and 132b of the first thin film transistor TR1. By the dopant doping and diffusion of the first and second conductor portions 233a and 233b shown in FIGS. 2 to 5, which will be described later, if the first and second conductor portions 233a and 233b of the second thin film transistor TR2 are highly doped with the dopant in comparison to the first and second conductor portions 133a and 133b of the first thin film transistor TR1, the first direction X length of the first and second middle portions 232a and 232b of the second thin film transistor TR2 may be longer than the first direction X length of the first and second middle portions 132a and 132b of the first thin film transistor TR1. Accordingly, the second thin film transistor TR2 may have the length of the first and second middle portions 232a and 232b relatively longer than that of the first thin film transistor TR1.

The second thin film transistor TR2 having the above-described configuration has the relatively low resistance in the first and second conductor portions 233a and 233b, the relatively long length in the first and second middle portions 232a and 232b, and the relatively short length in the channel portion 131, whereby the second thin film transistor TR2 may be applied to a thin film transistor which requires high mobility and high on-current.

Referring to the description of the first thin film transistor TR1 and the second thin film transistor TR2, a dopant doping process performed on the first and second conductor portions 133a and 133b of the first thin film transistor TR1 may be different from a dopant doping process performed on the first and second conductor portions 233a and 233b of the second thin film transistor TR2 according to the electrical characteristics required for each thin film transistor. The first thin film transistor TR1 and the second thin film transistor TR2 may exhibit the different electrical characteristics of threshold voltage, on-current, carrier mobility, and short channel effect ($V_{th}$ roll off, HCS, etc.).

For example, when the first thin film transistor TR1 and the second thin film transistor TR2 have the same first direction X length of the gate electrode 150, and the dopant concentration in the first and second conductor portions 233a and 233b of the second thin film transistor TR2 is greater than the dopant concentration in the first and second conductor portions 133a and 133b of the first thin film transistor TR1, the length of the channel portion 231 of the second thin film transistor TR2 may be shorter than the length of the channel portion 131 of the first thin film transistor TR1.

In this case, the first and second conductor portions 133a and 133b of the first thin film transistor TR1 may have high resistance and low mobility due to the relatively low dopant concentration, and the length of the channel portion 131 may be relatively long compared to the second thin film transistor TR2, so that it is possible to reduce a short channel effect generated in a thin film transistor having a short channel length such as a hot carrier stress HCS and a threshold voltage roll-off phenomenon Vth roll-off.

Also, the first and second conductor portions 233a and 233b of the second thin film transistor TR2 may have low resistance and high mobility due to the relatively high dopant concentration, and the length of the channel portion 131 may be shortened, so that it is possible to have high on-current.

The first conductor portion 133a and the second conductor portion 133b of the first thin film transistor TR1 and the first conductor portion 233a and the second conductor portion 233b of the second thin film transistor TR2 may be formed by selective conduction of the active layers 130 and 230. Herein, the selective conduction may be performed by an ion implantation process, and the dopant used in the ion implantation may include at least one of boron B, phosphorus P, fluorine F, and hydrogen H.

According to the embodiment of the present disclosure, the first conductor portions 133a and 233a of the active layers 130 and 230 may be source regions, and the second conductor portions 133b and 233b of the active layers 130 and 230 may be drain regions. However, the embodiment of the present disclosure is not limited thereto, and the first conductor portions 133a and 233a may be the drain regions, and the second conductor portions 133b and 233b may be the source regions.

According to one embodiment of the present disclosure, the active layers 130 and 230 may include an oxide semiconductor material. Also, the active layers 130 and 230 may include a plurality of active layers sequentially stacked in a double-layered structure or a triple-layered structure as well as a single-layered structure, and may include the same or different oxide semiconductor materials when the active layer 130 and 230 of the double-layered structure or the triple-layered structure is applied.

The gate electrodes 150 and 250 may be disposed on the gate insulating film 140 in each of the first thin film transistor TR1 and the second thin film transistor TR2. The gate electrodes 150 and 250 respectively overlap the channel portion 131 and 231 of the active layer 130 and 230 and may respectively overlap the first middle portions 132a and 232a and the second middle portions 132b and 232b.

According to the embodiment of the present disclosure, the gate electrodes 150 and 250 may include at least one of aluminum-based metal materials such as aluminum Al or aluminum alloys, silver-based metal materials such as silver Ag or silver alloys, copper-based metal materials such as copper Cu or copper alloys, molybdenum-based metal materials such as molybdenum Mo or molybdenum alloys, chromium Cr, tantalum Ta, neodymium Nd, and titanium Ti. Each gate electrode 150 and 250 may have a multi-layered structure including at least two conductive films having the different physical properties.

An interlayer insulating film 160 may be commonly disposed on the gate electrodes 150 and 250 and the gate insulating film 140 of the first thin film transistor TR1 and the second thin film transistor TR2.

The interlayer insulating film 160 may include a silicon oxide film SiOx or a silicon nitride layer SiNx and may protect the thin film transistor.

A portion of the interlayer insulating film 160 corresponding to a contact hole may be removed to contact the active layer 130 and 230 to a first electrode 171 and 271 and a second electrode 172 and 272.

The first electrode 171 and the second electrode 172 of the first thin film transistor TR1 may be disposed on the interlayer insulating film 160.

The first electrode 171 and the second electrode 172 of the first thin film transistor TR1 may respectively overlap the first conductor portion 133a and the second conductor portion 133b. The first electrode 171 may serve as a source electrode, and the second electrode 172 may serve as a drain electrode. However, the embodiments of the present disclosure are not limited thereto, and the first electrode 171 may serve as a drain electrode, and the second electrode 172 may serve as a source electrode. In addition, the first conductor portion 133a and the second conductor portion 133b serve as a source electrode and a drain electrode, respectively, and the first electrode 171 and the second electrode 172 may serve as a connection electrode between the devices.

The first electrode 171 and the second electrode 172 may respectively be connected to the active layer 130 through first and second contact holes CH1 and CH2, respectively. Specifically, the first electrode 171 may be in contact with the first conductor portion 133a through the first contact hole CH1, and the second electrode 172 may be spaced apart from the first electrode 171 and may be in contact with the second conductor portion 133b through the second contact hole CH2.

A description for the first electrode 171, the second electrode 172, the first contact hole CH1, and the second contact hole CH2 may be equally applied to that of the second thin film transistor TR2.

For convenience of explanation, it is shown that the dopant concentration of the middle portion 132a and 132b of the first thin film transistor TR1 is linearly changed (e.g., varied) between the channel portion 131 and the first and second conductor portions 133a and 133b. However, the dopant concentration of the middle portion 132a and 132b of the first thin film transistor TR1 may be a streamlined curve, a log-type curve, and an exponential curve in which a dopant concentration gradient varies. A description for this concentration may be equally applied to that of the second thin film transistor TR2.

Figure 3:
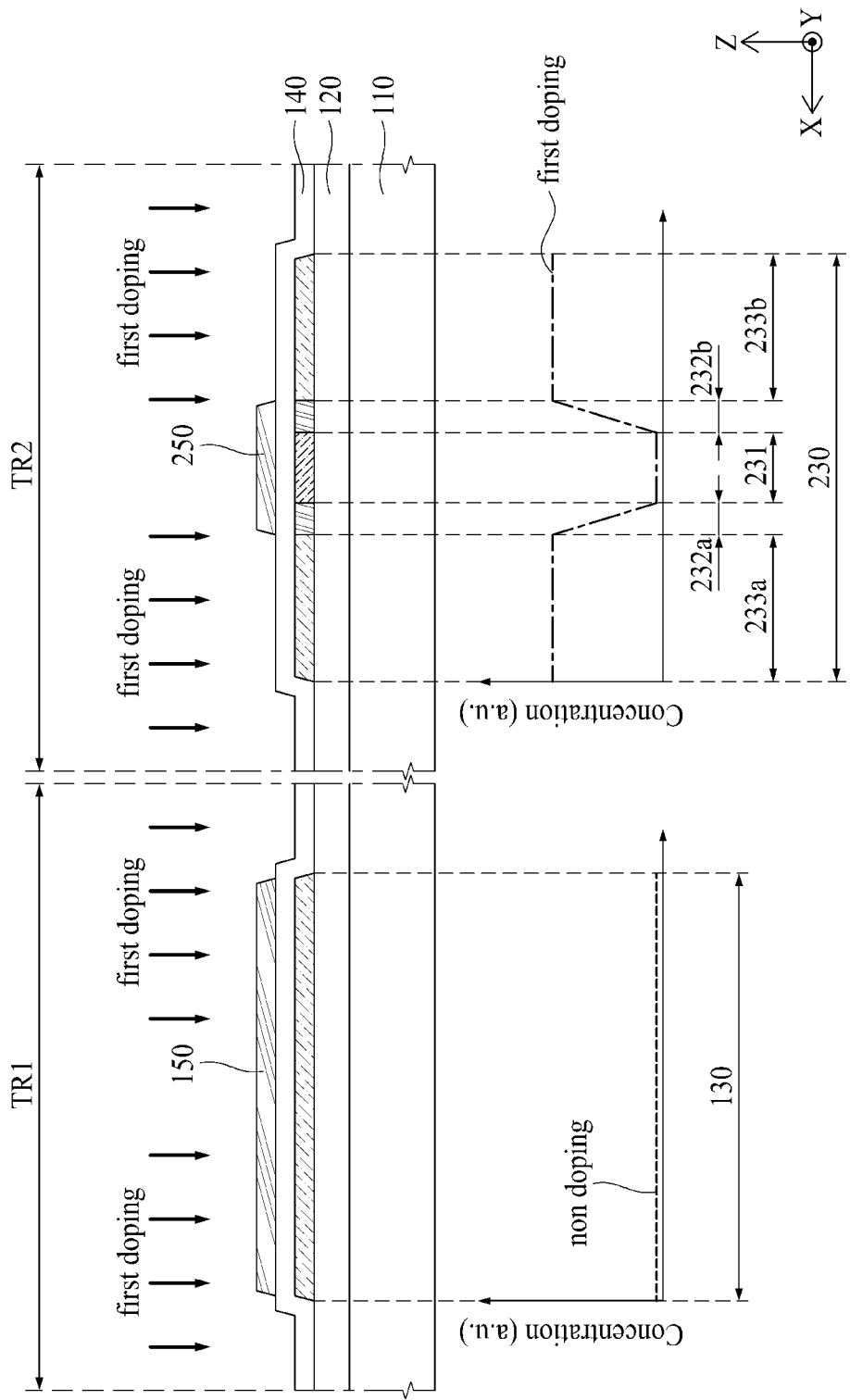
FIG. 3 illustrates a first doping of the thin film transistor array according to one embodiment of the present disclosure.
Figure 4:
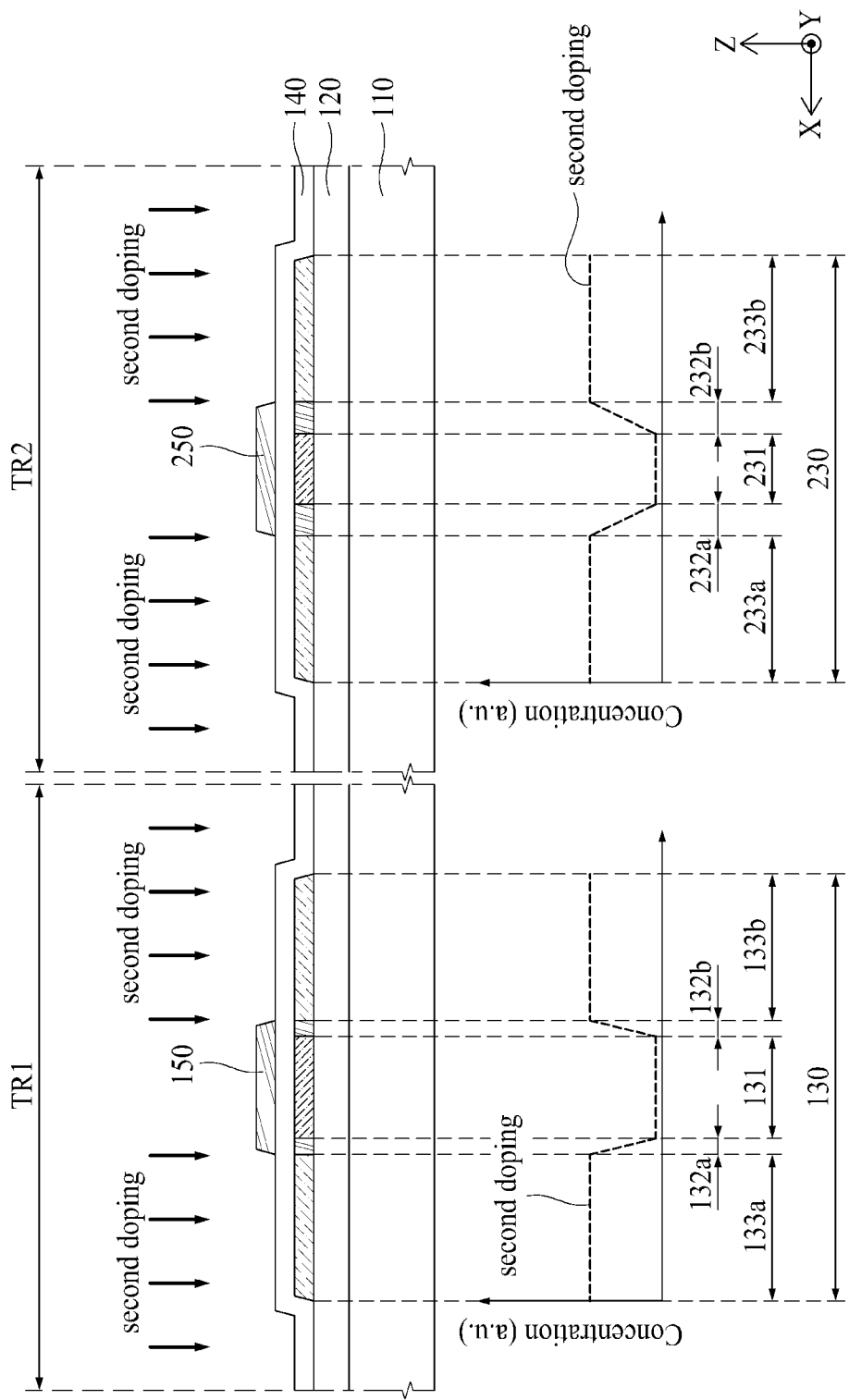
FIG. 4 illustrates a second doping of the thin film transistor array according to one embodiment of the present disclosure.

FIG. 3 illustrates the first doping of the thin film transistor array according to the present disclosure, and FIG. 4 illustrates the second doping of the thin film transistor array according to the present disclosure.

Referring to FIG. 3, the first doping may be commonly performed on the first thin film transistor TR1 and the second thin film transistor TR2 of the thin film transistor array 100. In the process in which the first doping is performed on the thin film transistor array 100, the gate electrode 150 of the first thin film transistor TR1 may not be patterned or may be patterned to cover all the active layer 130, and the gate electrode 250 of the second thin film transistor TR2 may be patterned to expose the first and second conductor portions 233a and 233b.

In the dopant doping process, the gate electrode 250 of the second thin film transistor TR2 includes a metal material, and thus, may function as a type of mask for the dopant doping process performed by the ion implantation process. On the other hand, even if the gate insulating film 140 is not patterned to expose the active layer 230, the dopant material of the ion implantation process may penetrate through the gate insulating film 140, whereby it is possible to perform the doping on the active layer 230 through the dopant doping process. However, the process conditions of the dopant doping process, for example, acceleration energy and dopant ion beam current of the dopant doping process may be adjusted according to the thickness of the gate insulating film 140 within a process condition range generally known to those in the art.

Therefore, in case of the active layer 130 of the first thin film transistor TR1, there is no change in the doping state before and after the first doping. Meanwhile, in case of the active layer 230 of the second thin film transistor TR2, the ion implantation at a first doping concentration may be carried out thereto. According to one embodiment of the present disclosure, the first doping may be performed by the ion doping through the ion implantation. In the active layer 130 of the first thin film transistor TR1, the ions or dopant of the first doping may be masked by the gate electrode 150, and the dopant by the first doping may not be formed on the active layer 130 of the first thin film transistor TR1. Accordingly, the active layer 130 of the first thin film transistor TR1 may have a non-doping state concentration, which may be a concentration of an initial dopant before doping the active layer 130 of the first thin film transistor TR1.

Specifically, the first and second conductor portions 233a and 233b of the second thin film transistor TR2 may be ion-implanted at a first doping concentration, for example, the dopant concentration condition of the first doping may be in a condition of 1e15 to 4e15 ions/cm$^3$, and the dopant used in the first doping may include at least one of boron B, phosphorus P, fluorine F, and hydrogen H.

The doping concentration of the first and second conductor portions 233a and 233b of the second thin film transistor TR2 by the first doping may be equal to or greater than the doping concentration of the first and second middle portions 232a and 232b, and the doping concentration of the first and second middle portions 232a and 232b of the second thin film transistor TR2 may be equal to or greater than the concentration of the channel portion 231. The doping concentration of the first and second conductor portions 233a and 233b of the second thin film transistor TR2 may be greater than the doping concentration of the first and second middle portions 232a and 232b except for the boundary adjacent to the first and second middle portions 232a and 232b. The doping concentration of the first and second middle portions 232a and 232b of the second thin film transistor TR2 may be greater than the doping concentration of the channel portion 231 except for the boundary adjacent to the channel portion 231. As shown in FIG. 3, the doping concentration of the first and second middle portions 232a and 232b of the second thin film transistor TR2 may increase as it becomes closer to the first and second conductor portions 233a and 233b.

For convenience of explanation, it is shown that the dopant concentration of the middle portion 232a and 232b of the second thin film transistor TR2 is linearly changed (e.g., varies) between the channel portion 231 and the first and second conductor portions 233a and 233b. However, the dopant concentration of the middle portion 232a and 232b of the second thin film transistor TR2 may be a streamlined curve, a log-type curve, and an exponential curve in which a dopant concentration gradient varies.

Referring to FIG. 4, the second doping may be performed in common to the first thin film transistor TR1 and the second thin film transistor TR2 of the thin film transistor array 100. In this case, for the process in which the second doping is performed on the thin film transistor array 100, the gate electrode 150 of the first thin film transistor TR1 may be patterned to expose the first and second conductor portions 133a and 133b. According to one embodiment of the present disclosure, the second doping may be performed under the same acceleration energy condition as that of the first doping.

The active layer 130 of the first thin film transistor TR1 may be ion-implanted at a second doping concentration by the second doping, and the active layer 230 of the second thin film transistor TR2 may be ion-implanted at a second doping concentration. According to one embodiment of the present disclosure, the second doping may be performed by the ion doping through the ion implantation.

Specifically, the first and second conductor portions 133a and 133b of the first thin film transistor TR1 may be ion-implanted at a second doping concentration, for example, a dopant concentration condition of the second doping may be performed in a condition of 2e14 to 8e14 ions/cm³, and the dopant used in the second doping may include at least one of boron B, phosphorus P, fluorine F, and hydrogen H. The dopant used in the second doping may be the same as or different from the dopant used for the first doping.

In detail, the first and second conductor portions 233a and 233b of the second thin film transistor TR2 may be ion-implanted at a second doping concentration, for example, the dopant concentration condition of the second doping may be in a condition of 1e15 to 4e15 ions/cm³, and the dopant used in the second doping may include at least one of boron B, phosphorus P, fluorine F, and hydrogen H.

The doping concentration of the first and second conductor portions 133a and 133b of the first thin film transistor TR1 by the second doping may be equal to or greater than the doping concentration of the first and second middle portions 132a and 132b, and the doping concentration of the first and second middle portions 132a and 132b of the first thin film transistor TR1 may be equal to or greater than the concentration of the channel portion 131. The doping concentration of the first and second conductor portions 133a and 133b of the first thin film transistor TR1 may be greater than the doping concentration of the first and second middle portions 132a and 132b except for the boundary adjacent to the first and second middle portions 132a and 132b. The doping concentration of the first and second middle portions 132a and 132b of the first thin film transistor TR1 may be greater than the doping concentration of the channel portion 131 except for the boundary adjacent to the channel portion 131. As shown in FIG. 4, the doping concentration of the first and second middle portions 132a and 132b of the first thin film transistor TR1 may increase as it becomes closer to the first and second conductor portions 133a and 133b.

For convenience of explanation, it is shown that the dopant concentration of the middle portion 132a and 132b of the first thin film transistor TR1 is linearly changed (e.g., varies) between the channel portion 131 and the first and second conductor portions 133a and 133b. However, the dopant concentration of the middle portion 132a and 132b of the first thin film transistor TR1 may be a streamlined curve, a log-type curve, and an exponential curve in which a dopant concentration gradient varies.

The doping concentration of the first and second conductor portions 233a and 233b of the second thin film transistor TR2 by the second doping may be equal to or greater than the doping concentration of the first and second middle portions 232a and 232b. The doping concentration of the first and second middle portions 232a and 232b of the second thin film transistor TR2 may be equal to or greater than the concentration of the channel portion 231. The doping concentration of the first and second conductor portions 233a and 233b of the second thin film transistor TR2 may be greater than the doping concentration of the first and second middle portions 232a and 232b except for the boundary adjacent to the first and second middle portions 232a and 232b. The doping concentration of the first and second middle portions 232a and 232b of the second thin film transistor TR2 may be greater than the doping concentration of the channel portion 231 except for the boundary adjacent to the channel portion 231. As shown in FIG. 4, the doping concentration of the first and second middle portions 232a and 232b of the second thin film transistor TR2 may increase as it becomes closer to the first and second conductor portions 233a and 233b.

For convenience of explanation, it is shown that the dopant concentration of the middle portion 232a and 232b of the second thin film transistor TR2 is linearly changed (e.g., varies) between the channel portion 231 and the first and second conductor portions 233a and 233b. However, the dopant concentration of the middle portion 232a and 232b of the second thin film transistor TR2 may be a streamlined curve, a log-type curve, and an exponential curve in which a dopant concentration gradient varies.

Figure 5:
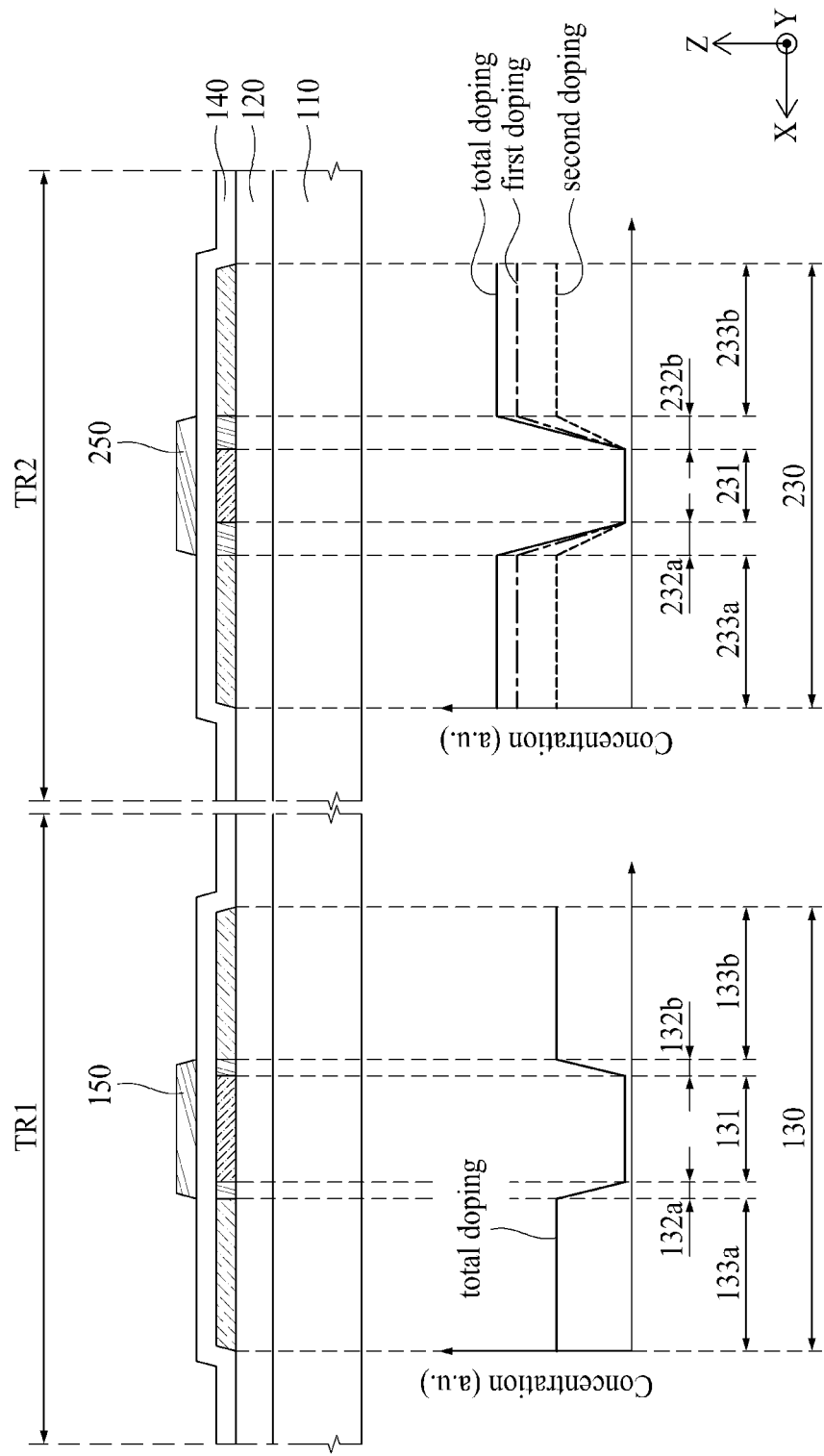
FIG. 5 is a graph comparing a first doping concentration, a second doping concentration, and a total doping concentration of the thin film transistor array according to one embodiment of the present disclosure.

FIG. 5 is a graph comparing the first doping concentration, the second doping concentration, and the total doping concentration of the thin film transistor array of the present disclosure. The total doping concentration in FIG. 5 is the sum of the first doping concentration and the second doping concentration described in FIGS. 3 and 4.

The total doping concentration of the active layer 130 of the first thin film transistor TR1 and the active layer 230 of the second thin film transistor TR2 may be determined by the first doping and the second doping illustrated in FIGS. 3 and 4.

Since the ion implantation process of the first doping performed on the active layer 130 of the first thin film transistor TR1 is masked by the gate electrode 150, the active layer 130 of the first thin film transistor TR1 may be ion-implanted by the second doping but not the first doping. Therefore, the total doping concentration of the active layer 130 of the first thin film transistor TR1 may be determined by the second doping, and the total doping concentration of the active layer 130 of the first thin film transistor TR1 may have the same concentration as the second doping concentration.

Since the active layer 230 of the second thin film transistor TR2 is ion-implanted by the first doping and the second doping, the total doping concentration of the active layer 230 of the second thin film transistor TR2 is determined by the sum of the concentration of the first doping and the concentration of the second doping.

According to one embodiment of the present disclosure, the total doping concentration of the first and second conductor portions 133a and 133b of the first thin film transistor TR1 may be less than the total doping concentration of the first and second conductor portions 233a and 233b of the second thin film transistor TR2, and the total doping concentration of the first and second middle portions 132a and 132b of the first thin film transistor TR1 may be less than the total doping concentration of the first and second middle portions 232a and 232b of the second thin film transistor TR2, and the total doping concentration of the channel portion 131 of the first thin film transistor TR1 may be the same as the total doping concentration of the channel portion 231 of the second thin film transistor TR2.

Figure 6:
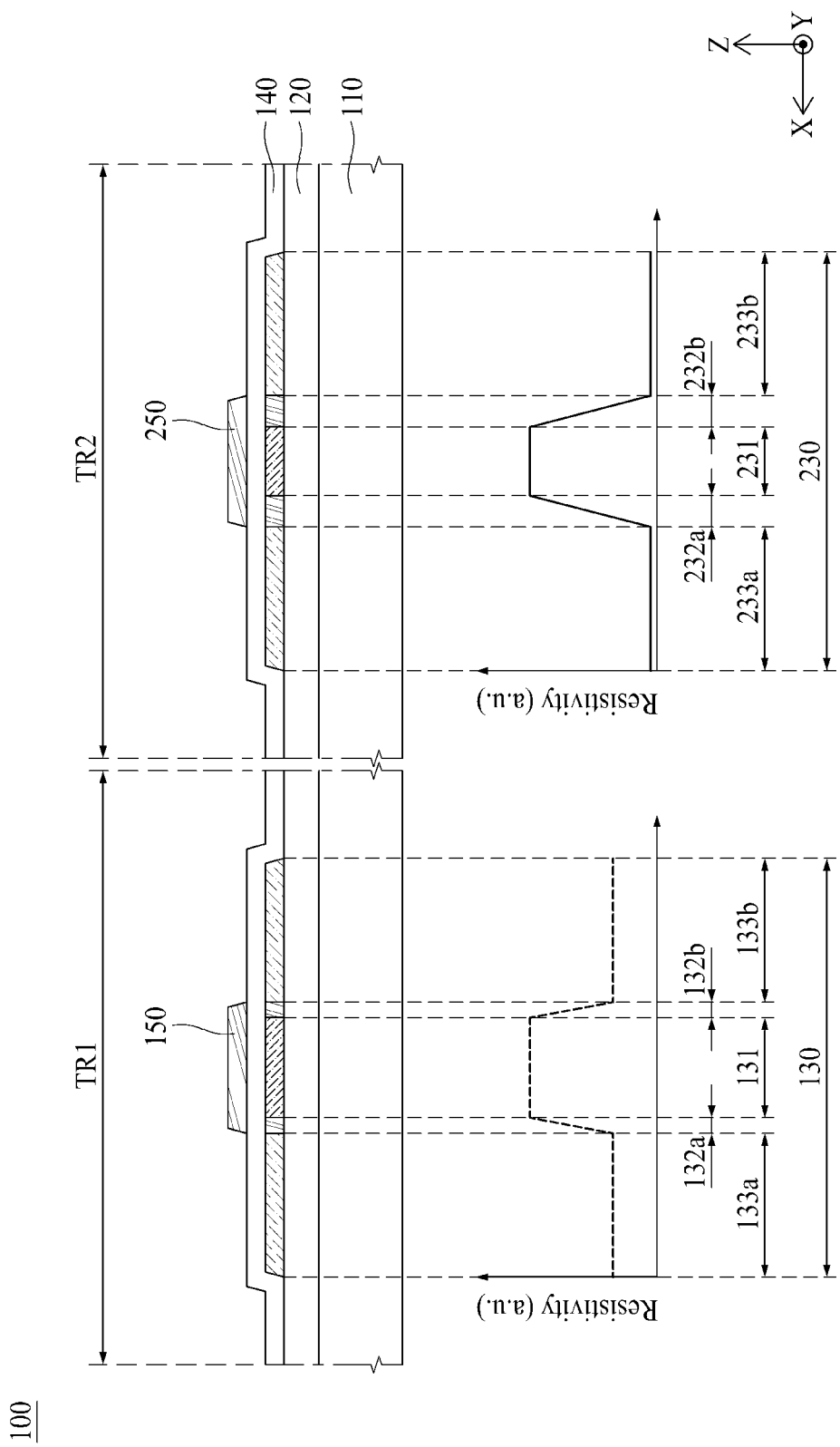
FIG. 6 illustrates resistivity of first and second thin film transistors of the thin film transistor array according to the embodiment of the present disclosure.

FIG. 6 illustrates resistivity of the first and second thin film transistors of the thin film transistor array according to the embodiment of the present disclosure.

Referring to FIG. 6, in case of the first thin film transistor TR1 of the thin film transistor array, resistivity is uniformly decreased along a direction from the channel portion 131 toward the first and second conductor portions 133a and 133b. In case of the second thin film transistor TR2, resistivity is uniformly decreased along a direction from the channel portion 231 toward the first and second conductor portions 233a and 233b.

According to one embodiment of the present disclosure, the resistivity of the first and second conductor portions 133a and 133b of the first thin film transistor TR1 may be greater than the resistivity of the first and second conductor portions 233a and 233b of the second thin film transistor TR2, which may be inversely proportional to the total doping concentration of the active layer 130 of the first thin film transistor TR1 and the active layer 230 of the second thin film transistor TR2. The degree of conductivity in the first and second conductor portions 133a and 133b of the first thin film transistor TR1 and the first and second conductor portions 233a and 233b of the second thin film transistor TR2 may be proportional to the total doping concentration of the first and second conductor portions 133a and 133b of the first thin film transistor TR1 and the first and second conductor portions 233a and 233b of the second thin film transistor TR2, described in FIG. 5. The degree of conductivity in the first and second conductor portions 133a and 133b of the first thin film transistor TR1 and the first and second conductor portions 233a and 233b of the second thin film transistor TR2 may refer to the electrical conductivity or mobility of the thin film transistor. Therefore, the resistivity of the first and second conductor portions 133a and 133b of the first thin film transistor TR1 and the first and second conductor portions 233a and 233b of the second thin film transistor TR2 may have a value inversely proportional to the total doping concentration of the first and second conductor portions 133a and 133b of the first thin film transistor TR1 and the first and second conductor portions 233a and 233b of the second thin film transistor TR2.

FIG. 7 is a graph of the dopant concentration according to the depth of dopant doping set in various conditions. In FIG. 7, the ion implantation process of the dopant doping is performed on a planarized film in which the first thin film transistor TR1 and the second thin film transistor TR2 are not formed, wherein the planarized film may be prepared by forming the buffer layer 120 on the substrate, the gate insulating film 140 on the buffer layer 120, and the interlayer insulating film 160 on the gate insulating film 140. The dopant of the ion implantation process is formed of boron B, the acceleration energy is set to 40 keV, and the doping concentration of boron B is changed to the condition of 1E13 ions/cm$^3$, 1E14 ions/cm$^3$, and 1E15 ions/cm$^3$. In FIG. 7, a horizontal axis is the depth from the surface of the interlayer insulating film 160, and a vertical axis is the number of ions measured by a secondary ion mass spectroscopy SIMS. In FIG. 7, a solid line shows the dopant doping concentration of boron B set to 1E13 ions/cm$^3$, a dash-single dotted line shows the dopant doping concentration of boron B set to 1E14 ions/cm$^3$, and a dotted line shows the dopant doping concentration of boron B set to 1E15 ions/cm$^3$.

Referring to FIG. 7, a plurality of boron B is observed at the interface between the interlayer insulating film 160 and the gate insulating film 140 under the dopant doping concentration conditions of 1E13 ions/cm$^3$, 1E14 ions/cm$^3$, and 1E15 ions/cm$^3$, and the maximum concentration peak of boron B is observed at the interface between the buffer layer 120 and the gate insulating film 140. When the result of FIG. 7 is applied to the thin film transistor array of FIG. 1, the maximum concentration peak of boron B corresponds to the active layer 130 formed on the buffer layer 120 under the boron B dopant ion implantation condition set in the condition of FIG. 7. Therefore, when the ion implantation process under the ion implantation condition set in FIG. 7 is performed, the dopant of the ion implantation process is formed on the active layer 130 of the first thin film transistor TR1 and the active layer 230 of the second thin film transistor TR2 of the thin film transistor array 100 according to the present disclosure.

With reference to data obtained by converting the number of ions counted under the dopant doping concentration condition of 1E13 ions/cm$^3$, 1E14 ions/cm$^3$, and 1E15 ions/cm$^3$ by secondary ion mass spectroscopy SIMS to atomic percent at % in the active layer 130 based on a standard sample, boron B is contained in the active layer 130 at a concentration of about 0.01 to 0.1 at % when the dopant doping of boron B is performed under the condition of 1E14 ions/cm$^3$, and boron B is contained in the active layer 130 at a concentration of about 0.1 to 0.2 at % when the dopant doping of boron B is performed under the condition of 1E15 ions/cm$^3$.

Figure 8:
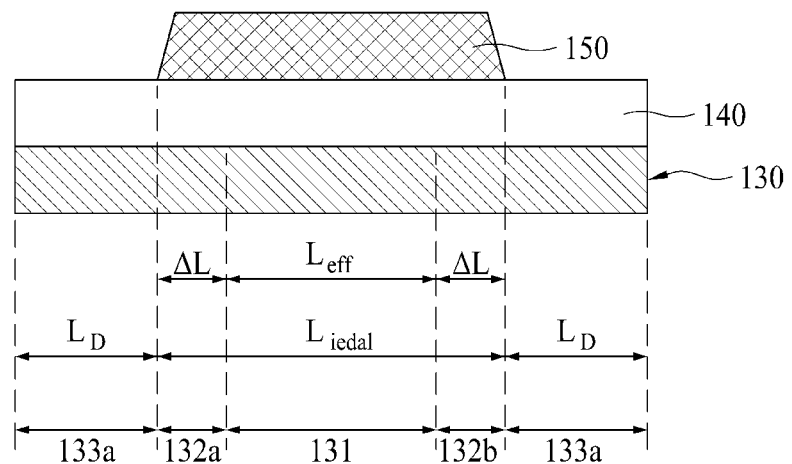
FIG. 8 is a schematic diagram illustrating a conductor penetration depth of a middle portion according to one embodiment of the present disclosure.

FIG. 8 is a schematic diagram illustrating the conductor penetration depth ΔL of the middle portion.

In FIG. 8, the sum length of the middle portion 132a and 132b and the channel portion 131 of the active layer 130 overlapping the gate electrode 150 is indicated as "$L_{ideal}$", and "$L_{ideal}$" may be referred to as the ideal length of the channel portion when there are no first and second middle portions 132a and 132b by the first and second conductor portions 133a and 133b.

Next, the length of the first and second middle portions 132a and 132b is indicated as "ΔL", and the first and second middle portions 132a and 132b are prepared by the diffusion of the dopant of the first and second conductor portions 133a and 133b, so that "ΔL" means that the channel length of the active layer 130 is reduced. Alternatively, the length "ΔL" of the first and second middle portions 132a and 132b may indicate the reduction degree of the channel length by the diffusion of the dopant of the first and second conductor portions 133a and 133b.

Accordingly, the ideal length $L_{ideal}$ of the channel portion may be reduced by the length ΔL of the first and second middle portions 132a and 132b, and the reduced length of the channel portion may be defined as an effective channel length $L_{eff}$.

When the length ΔL of the first and second middle portions 132a and 132b is increased, the effective channel length $L_{eff}$ may be reduced. Meanwhile, when the length ΔL of the first and second middle portions 132a and 132b is shortened, the effective channel length $L_{eff}$ may be increased.

The length ΔL of the first and second middle portions 132a and 132b may be set to be proportional to the dopant doping concentration performed in the first and second conductor portions 133a and 133b. For example, if the dopant concentration of the first and second conductor portions 133a and 133b of the first thin film transistor TR1 is set to be less than the dopant concentration of the first and second conductor portions 233a and 233b of the second thin film transistor TR2, the length ΔL of the first and second middle portions 132a and 132b of the first thin film transistor TR1 may be less than the length ΔL of the first and second middle portions 232a and 232b of the second thin film transistor TR2. As a result, the effective channel length $L_{eff}$ of the first thin film transistor TR1 may be increased as compared to that of the second thin film transistor TR2.

In this case, the effective channel length $L_{eff}$ of the active layer 130 of the first thin film transistor TR1 may have a relatively long length as compared to the effective channel length $L_{eff}$ of the active layer 230 of the second thin film transistor TR2. Thus, if the active layer 130 having the relatively long effective channel length $L_{eff}$ is applied to the thin film transistor having the short channel instead of the thin film transistor requiring the electrical characteristics such as high on-current and high mobility, it is possible to reduce the short channel effect generated in the thin film transistor having the short channel length, such as hot carrier stress HCS and threshold voltage roll-off phenomenon, owing to the relatively long effective channel length $L_{eff}$.

On the other hand, the effective channel length $L_{eff}$ of the active layer 230 of the second thin film transistor TR2 may have a relatively short length as compared to the effective channel length $L_{eff}$ of the active layer 130 of the first thin film transistor TR1. Thus, the threshold voltage may be shifted to a negative (−) direction, whereby the threshold voltage may be reduced, and the first and second conductor portions 233a and 233b of the second thin film transistor TR2 may have relatively low resistance and high mobility. Accordingly, the second thin film transistor TR2 may satisfy the electrical characteristics of high on-current and high mobility.

FIGS. 9A to 9F illustrate a fabrication method of the thin film transistor array according to the present disclosure.

Referring to FIG. 9A, the buffer layer 120 is commonly formed on the first thin film transistor TR1 and the second thin film transistor TR2 of the substrate 110. Then, the active layer 130 of the first thin film transistor TR1 and the active layer 230 of the second thin film transistor TR2 are formed on the buffer layer 120 and may be patterned to correspond to a predetermined portion. Herein, the predetermined portion may be partially overlapped with the gate electrode 150 and the first and second electrodes 171 and 172. Then, the gate insulating film 140 may be disposed on the buffer layer 120, may be disposed to cover the active layer 130 of the first thin film transistor TR1 and the active layer 230 of the second thin film transistor TR2, and may be commonly formed with respect to the first thin film transistor TR1 and the second thin film transistor TR2. Next, a gate electrode material layer is formed on the first and second thin film transistors TR1 and TR2, and the first and second thin film transistors TR1 and TR2 are patterned to have different gate electrode patterns. In detail, the gate electrode 150 of the first thin film transistor TR1 may be disposed to overlap the entire active layer 130, and the gate electrode 250 of the second thin film transistor TR2 may be patterned to overlap the channel portion 231 of the active layer 230 and the first and second middle portions 232a and 232b. Thus, the gate electrode 250 overlaps a portion of the active layer 230.

Figure 9B:
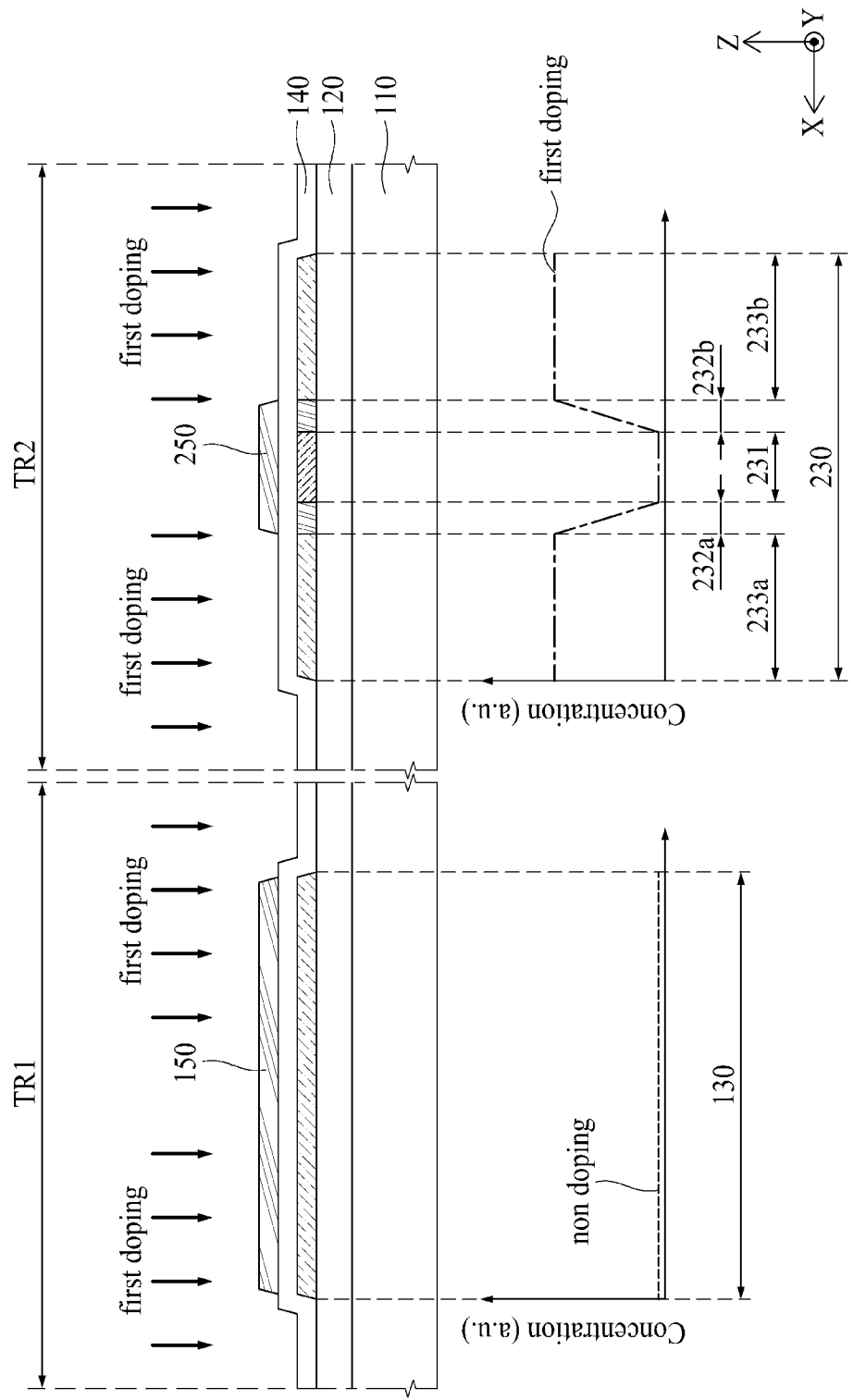

Referring to FIG. 9B, the first doping process is performed on the first and second thin film transistors TR1 and TR2 prepared by FIG. 9A.

According to one embodiment of the present disclosure, the first doping may be performed by the ion doping through the ion implantation, and the dopant used in the first doping may include at least one of boron B, phosphorus P, fluorine F, and hydrogen H. For example, the ion implantation process condition of the dopant of the first doping may be performed under the condition of 1e15 to 4e15 ions/cm³, and the acceleration energy and dopant ion beam current of the dopant of the first doping may be adjusted within the process condition range generally known to those in the art. Specifically, the acceleration energy of the dopant of the first doping may be set to the acceleration energy enabling the doping of the dopant on the active layers 130 and 230 of the first and second thin film transistors TR1 and TR2 and may be changed according to the thickness of the gate insulating film 140. For example, the acceleration energy of the dopant of the first doping may be increased if the thickness of the gate insulating film 140 is large, and the acceleration energy of the dopant of the first doping may be reduced if the thickness of the gate insulating film 140 is small.

The active layer 130 of the first thin film transistor TR1 may be masked by the gate electrode 150 which is overlapped with the active layer 130 while being provided on the active layer 130, and the dopant by the first doping may not be formed on the active layer 130 of the first thin film transistor TR1. Accordingly, the active layer 130 of the first thin film transistor TR1 may have the concentration of non-doping state, which may be the concentration of initial dopant before doping of the active layer 130 of the first thin film transistor TR1.

In case of the active layer 230 of the second thin film transistor TR2, the first and second conductor portions 233a and 233b may be ion-implanted by the first doping except for the channel portion 231 overlapping the gate electrode 250 and the first and second middle portions 232a and 232b. After the first doping, the first and second conductor portions 233a and 233b of the second thin film transistor TR2 may have the uniform doping concentration. The first and second middle portions 232a and 232b adjacent to the first and second conductor portions 233a and 233b of the second thin film transistor TR2 may be formed by the dopant diffused from the first and second conductor portions 233a and 233b. The first and second middle portions 232a and 232b may be provided in such a way that their dopant concentrations are reduced toward the channel portion 231 from the first and second conductor portions 233a and 233b. The channel portion 231 may be defined as the portion where the dopant of the first and second conductor portions 233a and 233b is not diffused. Accordingly, the channel portion 231 may have the same dopant concentration as the initial concentration of the dopant or the initial concentration of impurities when the active layer 230 is deposited.

Figure 9C:
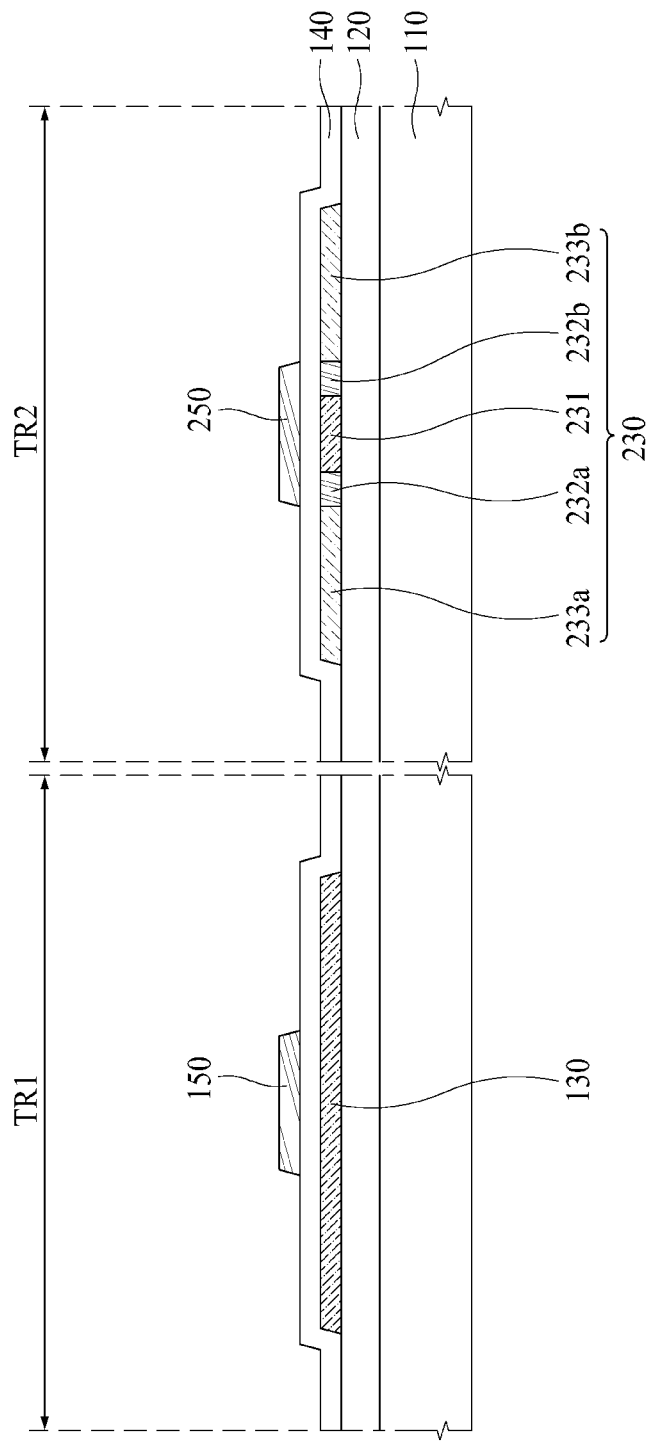

Referring to FIG. 9C, the gate electrode 150 of the first thin film transistor TR1 may be patterned to correspond to the predetermined portion. The gate electrode 150 of the first thin film transistor TR1 may be patterned to overlap the channel portion 131 of the active layer 130 and the first and second middle portions 132a and 132b.

Figure 9D:
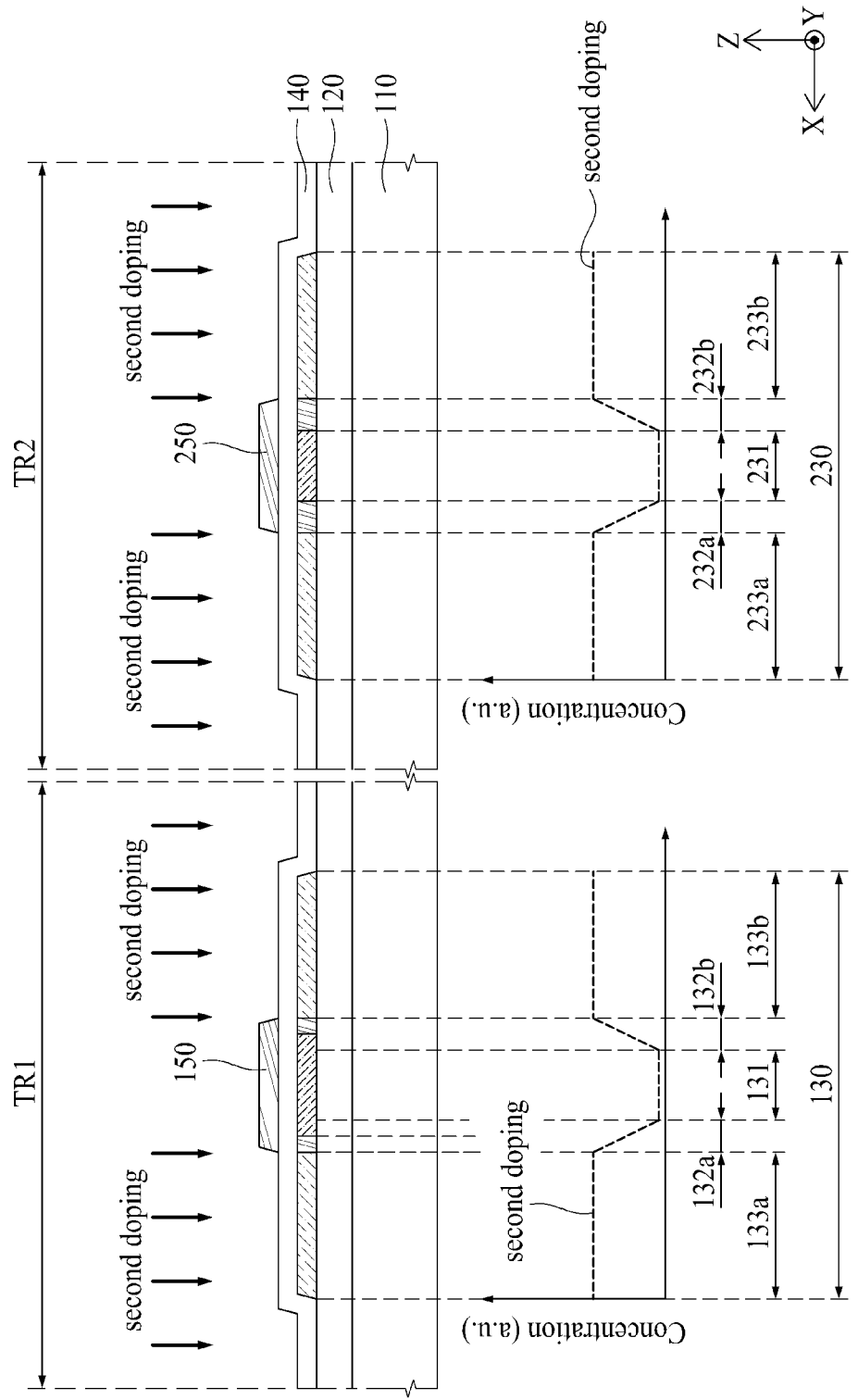

Referring to FIG. 9D, the second doping process is performed on the first and second thin film transistors TR1 and TR2 prepared by FIG. 9C.

According to one embodiment of the present disclosure, the second doping may be performed by the ion doping through the ion implantation, and the dopant used in the second doping may include at least one of boron B, phosphorus P, fluorine F, and hydrogen H. For example, the ion implantation process condition of the dopant of the second doping may be performed in the condition of 2e14 to 8e14 ions/cm³, and the acceleration energy and dopant ion beam current of the dopant of the second doping may be adjusted within the process condition range generally known to those in the art. For example, the ion implantation process condition of the second doping may be set to be the same as the first doping condition except for the dopant concentration condition.

In case of the active layer 130 of the first thin film transistor TR1, the first and second conductor portions 133a and 133b may be ion-implanted by the second doping except for the channel portion 131 overlapping the gate electrode 150 and the first and second middle portions 132a and 132b. After the second doping, the first and second conductor portions 133a and 133b of the first thin film transistor TR1 may have the uniform doping concentration. The first and second middle portions 132a and 132b adjacent to the first and second conductor portions 133a and 133b of the first thin film transistor TR1 may be formed by the dopant diffused from the first and second conductor portions 133a and 133b. The first and second middle portions 132a and 132b may be provided in such a way that their dopant concentrations are reduced toward the channel portion 131 from the first and second conductor portions 133a and 133b. The channel portion 131 may be defined as the portion where the dopant of the first and second conductor portions 133a and 133b is not diffused. Accordingly, the channel portion 131 may have the same dopant concentration as the initial concentration of the dopant or the initial concentration of impurities when the active layer 130 is deposited.

In case of the active layer 230 of the second thin film transistor TR2, the first and second conductor portions 233a and 233b may be ion-implanted by the second doping except for the channel portion 231 overlapping the gate electrode 250 and the first and second middle portions 232a and 232b. After the second doping, the first and second conductor portions 233a and 233b of the second thin film transistor TR2 may have the uniform doping concentration. The first and second middle portions 232a and 232b adjacent to the first and second conductor portions 233a and 233b of the second thin film transistor TR2 may be formed by the dopant diffused from the first and second conductor portions 233a and 233b. The first and second middle portions 232a and 232b may be provided in such a way that their dopant concentrations are reduced toward the channel portion 231 from the first and second conductor portions 233a and 233b. The channel portion 231 may be defined as the portion where the dopant of the first and second conductor portions 233a and 233b is not diffused. Accordingly, the channel portion 231 may have the same dopant concentration as the initial concentration of the dopant or the initial concentration of impurities when the active layer 230 is deposited.

Figure 9E:
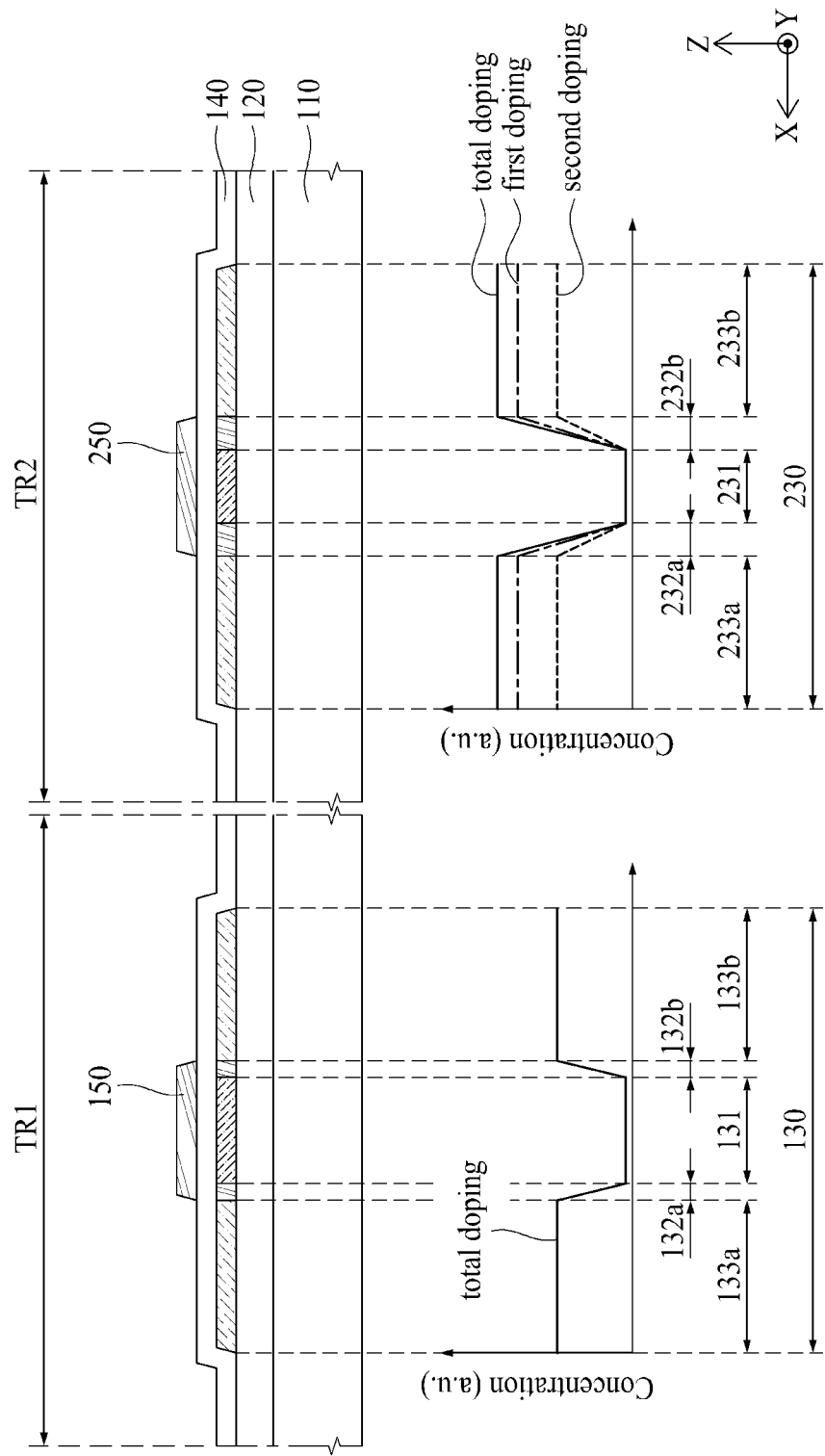

Referring to FIG. 9E, the total doping concentration of the active layer 130 of the first thin film transistor TR1 and the total doping concentration of the active layer 230 of the second thin film transistor TR2 may be determined by the above-described first doping and second doping.

Since the active layer 130 of the first thin film transistor TR1 is not ion-implanted by the first doping, but ion-implanted by the second doping, the total doping concentration of the active layer 130 of the first thin film transistor TR1 may be determined only by the second doping, and the total doping concentration of the active layer 130 of the first thin film transistor TR1 may have the same concentration as the second doping concentration.

Since the active layer 230 of the second thin film transistor TR2 is ion-implanted by the first doping and the second doping, the total doping concentration of the active layer 230 of the second thin film transistor TR2 may be determined by the sum of the concentration of the first doping and the concentration of the second doping.

At this time, the dopant concentration of the first and second conductor portions 133a and 133b of the first thin film transistor TR1 may be 0.01 to 0.8 at % with respect to the active layer 130, and the dopant concentration of the first and second conductor portions 233a and 233b of the second thin film transistor TR2 may be 0.1 to 0.8 at % with respect to the active layer 230.

Figure 9F:
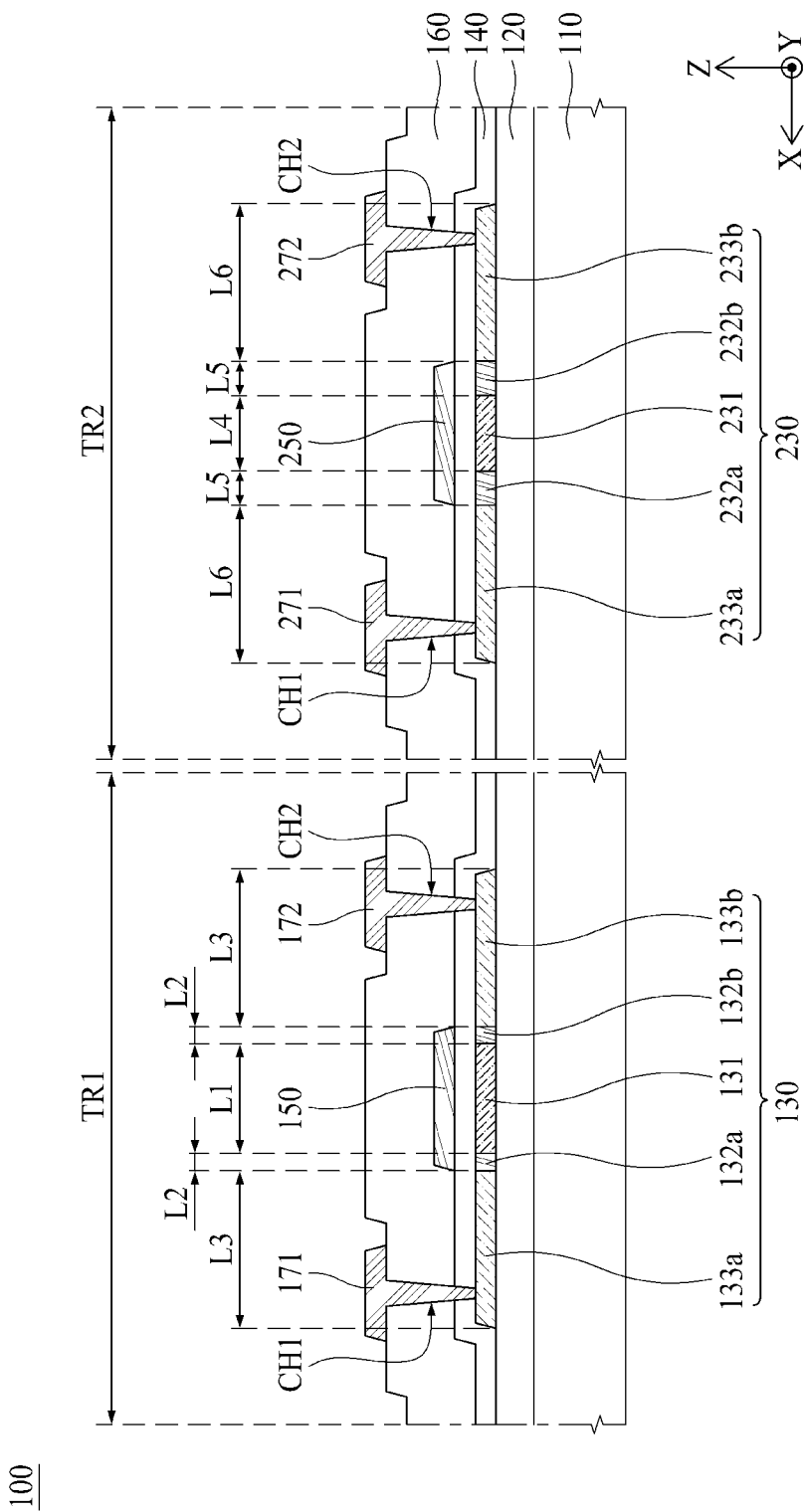

Referring to FIG. 9F, in case of the first thin film transistor TR1, the interlayer insulating film 160 is disposed on the gate electrode 150 and the gate insulating film 140. The first electrode 171 and the second electrode 172 are disposed on the interlayer insulating film 160, and the first electrode 171 and the second electrode 172 are connected to the active layer 130 through the first and second contact holes CH1 and CH2, respectively. The second thin film transistor TR2 may be applied with the same process as that of the first thin film transistor TR1. As a result, the thin film transistor array 100 according to the embodiment of the present disclosure may be fabricated.

Figure 10:
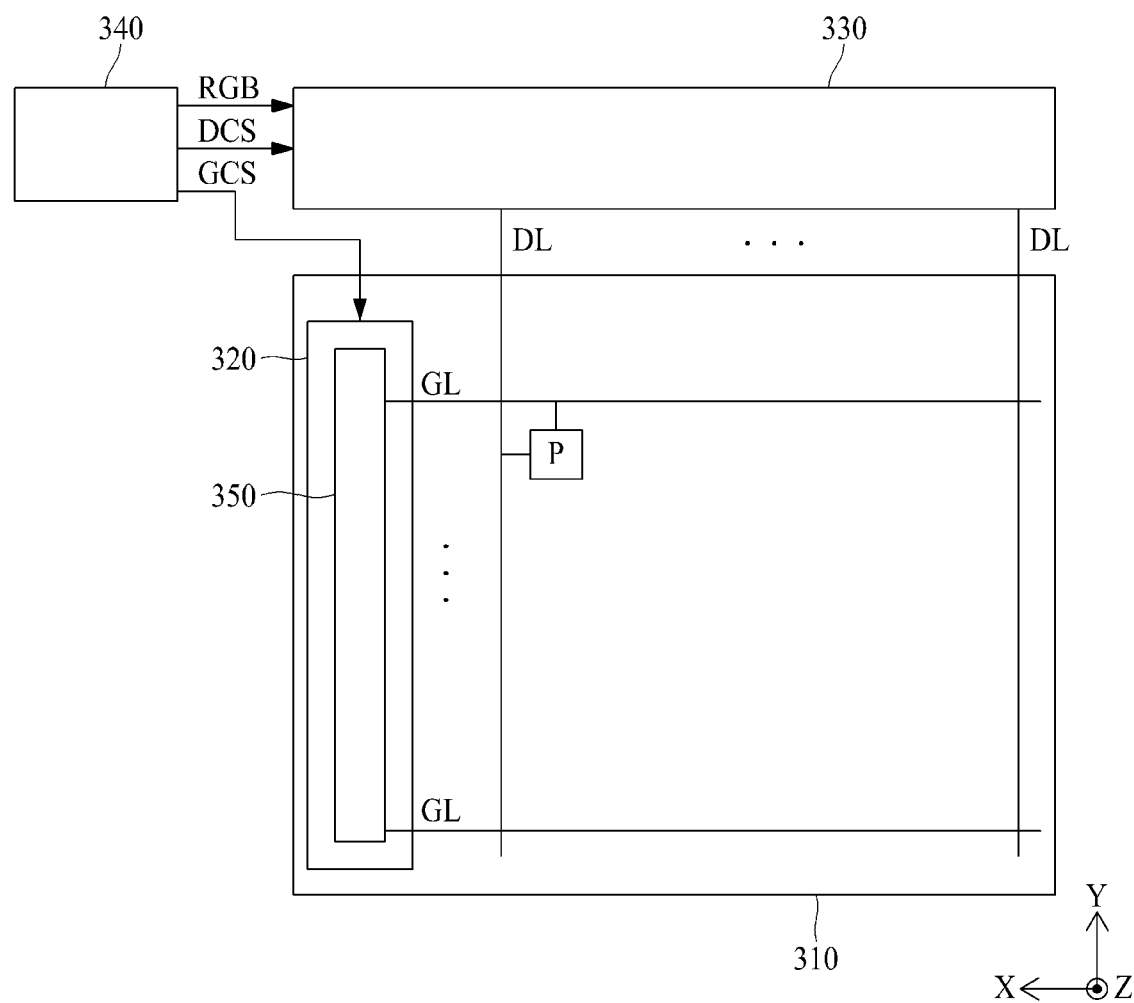
FIG. 10 is a schematic diagram of a display apparatus according to another embodiment of the present disclosure.

FIG. 10 is a schematic diagram of a display apparatus according to another embodiment of the present disclosure.

As shown in FIG. 10, a display apparatus 500 according to another embodiment of the present disclosure includes a display panel 310, a gate driver 320, a data driver 330, and a controller 340.

Gate lines GL and data lines DL are disposed on the display panel 310, and pixels P are disposed in respective crossing areas of the gate lines GL and the data lines DL. An image is displayed by driving the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input video data input from the external system and rearranges the sampled input video data, and supplies the rearranged digital video data RGB to the data driver 330.

The gate control signal GCS includes a gate start pulse GSP, a gate shift clock GSC, a gate output enable signal GOE, a start signal Vst, and a gate clock GCLK. Further, control signals for controlling a shift register may be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. Specifically, the data driver 330 converts the video data RGB inputted from the controller 340 into an analog data voltage and supplies the data voltage to the data lines DL.

The gate driver 320 may include the shift register 350.

The shift register 350 sequentially supplies gate pulses to the gate lines GL during one frame by the use of start signal and gate clock transmitted from the controller 340. Herein, the one frame refers to a period in which one image is outputted through the display panel 310. The gate pulse has a turn-on voltage capable of turning on a switching device (thin film transistor) disposed in the pixel P.

Also, during the remaining period of one frame, in which the gate pulse is not supplied, the shift register 350 supplies a gate-off signal capable of turning off the switching device to the gate line GL. Hereinafter, the gate pulse and the gate-off signal are totally referred to as a scan signal SS or Scan.

According to the embodiment of the present disclosure, the gate driver 320 may be mounted on a base substrate 110. As described above, a structure in which the gate driver 320 is directly mounted on the base substrate 110 is referred to as a gate-in-panel GIP structure.

Figure 11:
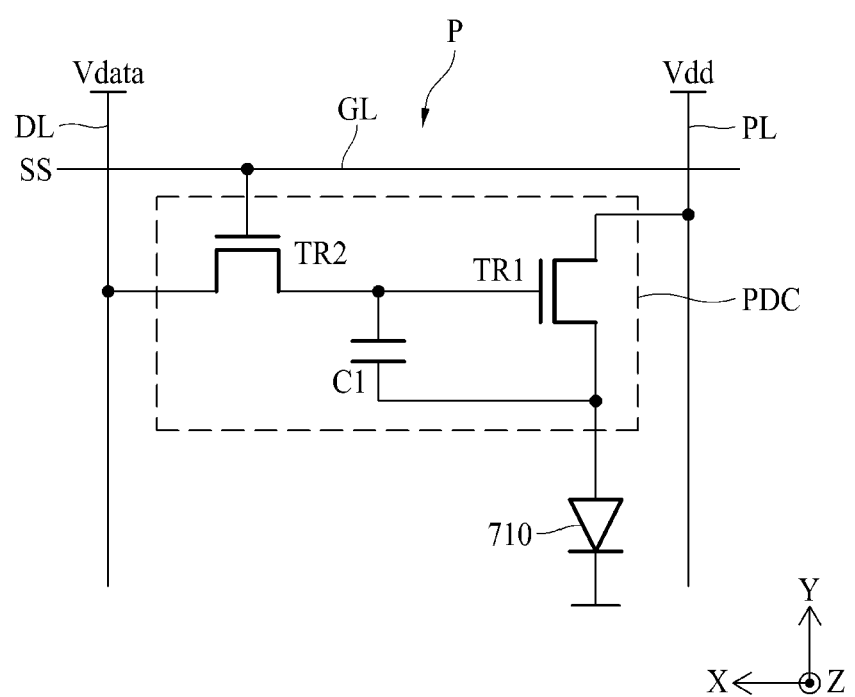
FIG. 11 is a circuit diagram of any one pixel P of FIG. 10 according to one embodiment of the present disclosure.
Figure 12:
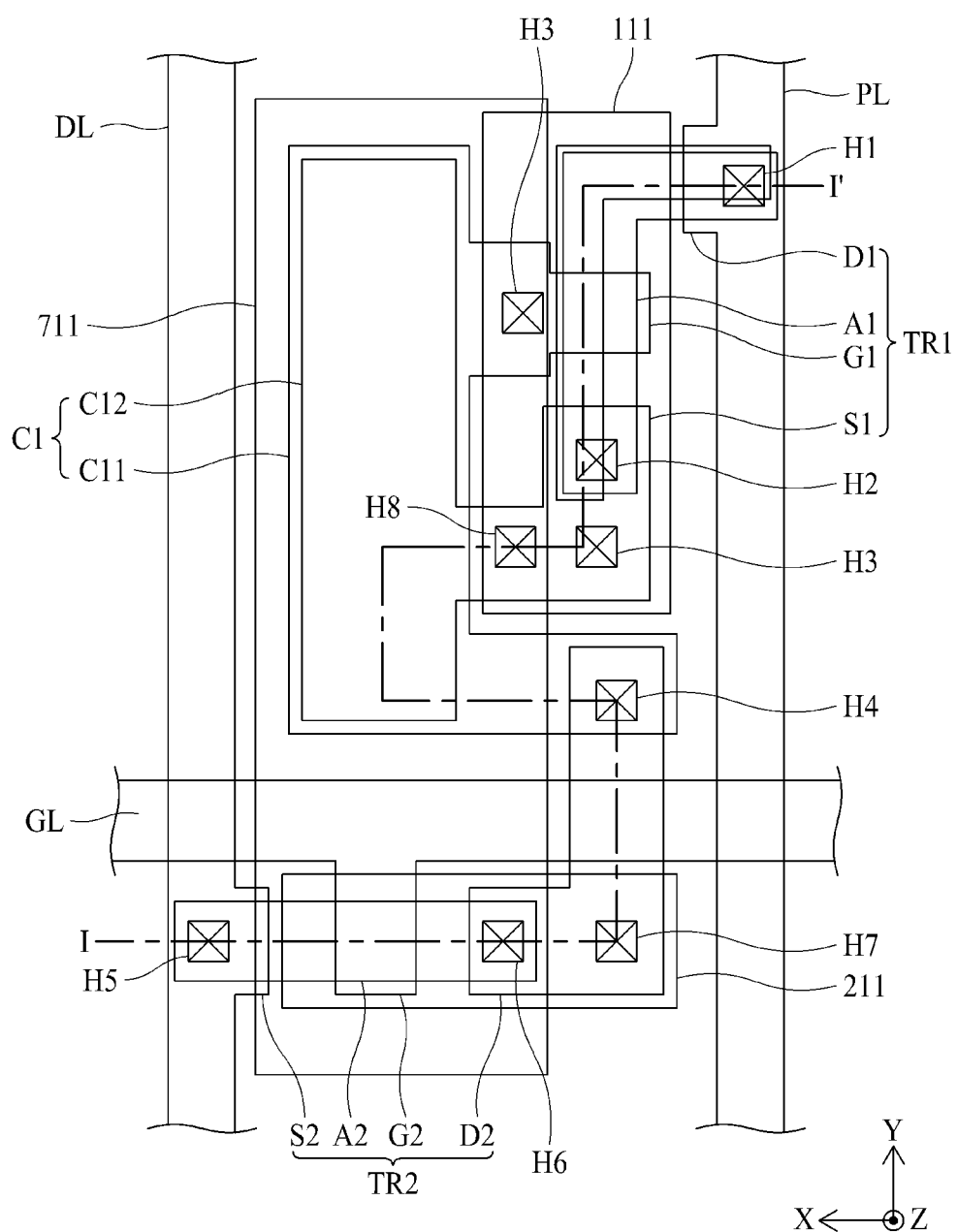
FIG. 12 is a plan view of the pixel P of FIG. 11 according to one embodiment of the present disclosure.
Figure 13:
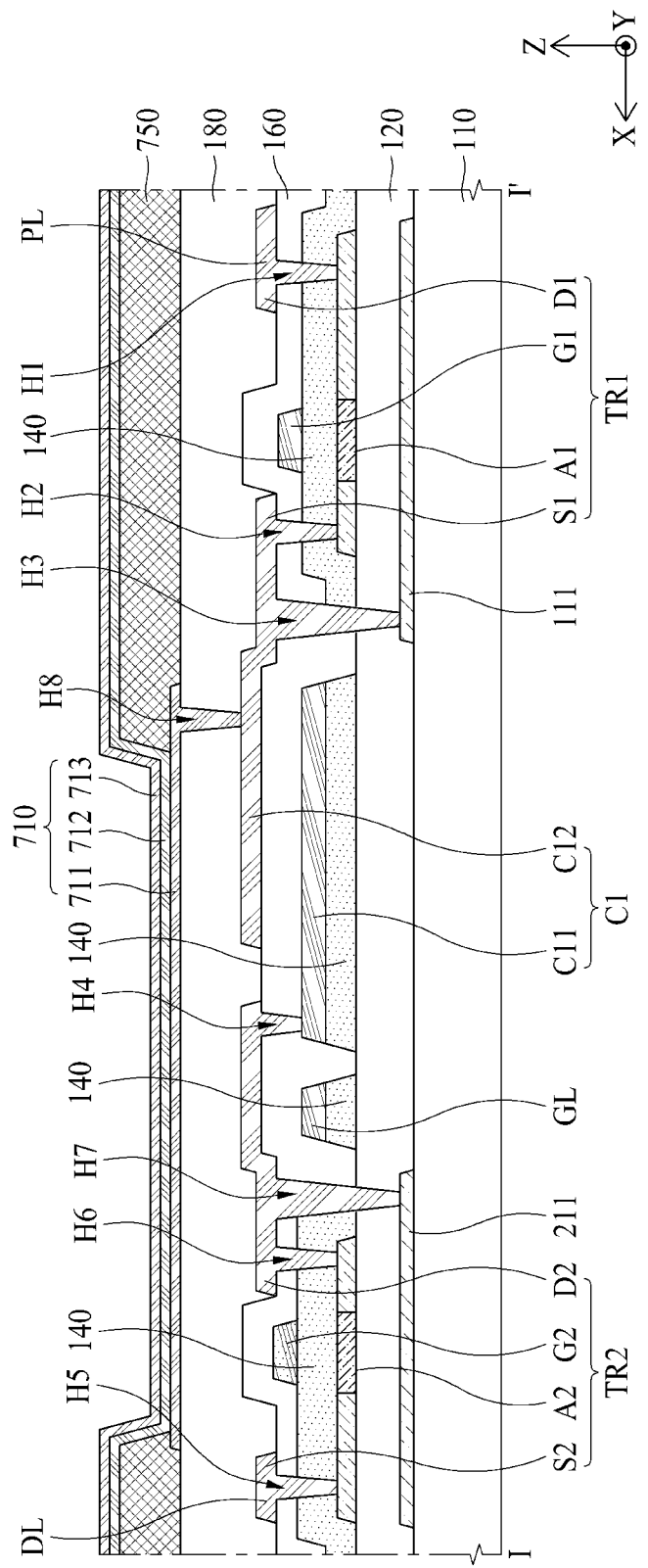
FIG. 13 is a cross sectional view along line III-III' of FIG. 12 according to one embodiment of the present disclosure.

FIG. 11 is a circuit diagram of any one pixel P of FIG. 10 according to one embodiment, FIG. 12 is a plan view of the pixel P of FIG. 11 according to one embodiment, and FIG. 13 is a cross sectional view along line III-III' of FIG. 12 according to one embodiment.

The circuit diagram of FIG. 11 is an equivalent circuit diagram of a pixel P of a display apparatus 500 including an organic light emitting diode OLED. The pixel P includes a display device 710 (e.g., a light emitting element such as the OLED), and a pixel driver PDC for driving the display device 710.

According to another embodiment of the present disclosure, the display apparatus includes the pixel driver PDC and the display device 710. The pixel driver PDC includes a first thin film transistor TR1 and a second thin film transistor TR2. The first thin film transistor TR1 may include the thin film transistors described above.

According to another embodiment of the present disclosure, the first thin film transistor TR1 is a driving transistor, and the second thin film transistor TR2 is a switching transistor.

The second thin film transistor TR2 is connected to a gate line GL and a data line DL, and is turned on or off by a scan signal SS supplied through the gate line GL.

The data line DL provides a data voltage Vdata to the pixel driver PDC, and the second thin film transistor TR2 controls the application of the data voltage Vdata.

A driving power line PL provides a driving voltage Vdd to the display device 710, and the first thin film transistor TR1 controls the driving voltage Vdd. The driving voltage Vdd is a pixel driving voltage for driving an organic light emitting diode OLED corresponding to the display device 710.

When the second thin film transistor TR2 is turned on by the scan signal SS applied through the gate line GL from a gate driver, the data voltage Vdata supplied through the data line DL is supplied to a gate electrode of the first thin film transistor TR1 connected to the display device 710. The data voltage Vdata is charged to a storage capacitor C1 formed between the gate electrode of the first thin film transistor TR1 and a source electrode of the first thin film transistor TR1.

An amount of current supplied to the organic light emitting diode OLED corresponding to the display device 710 through the first thin film transistor TR1 is controlled by the data voltage Vdata, whereby a grayscale of light emitted from the display device 710 may be controlled.

Referring to FIGS. 12 and 13, the first thin film transistor TR1 and the second thin film transistor TR2 are disposed on the substrate 110.

The substrate 110 may be a glass substrate, a curable or bendable thin film glass substrate, a plastic substrate, or a silicon wafer substrate. If using plastic for the substrate 110, transparent plastic having flexibility, for example, polyimide may be used. If the substrate 110 is formed of polyimide, heat resistant polyimide capable of enduring a high temperature may be used in consideration of a high temperature deposition process on the substrate 110.

Then, light shielding layers 111 and 211 may be disposed on the substrate 110.

The light shielding layers 111 and 211 block the external light being incident from the outside, to thereby protect active layers A1 and A2 and the first and second thin film transistors TR1 and TR2. The light shielding layers 111 and 211 may be made of a material having the light blocking characteristics or light reflection characteristics. The light shielding layers 111 and 211 may include a lower light shielding layer and an upper light shielding layer. The light shielding layers 111 and 211 may not be disposed on a whole surface of the substrate 110, but may be disposed on at least a portion overlapping the thin film transistor TR1 and TR2 or the active layer 130.

A buffer layer 120 is disposed on the light shielding layer 111 and 211 and the substrate 110.

The buffer layer 120 may be formed in a multi-layered structure by depositing at least one of a silicon oxide film SiOx, silicon nitride film SiN, and a silicon oxynitride film SiON. Other components of the thin film transistors TR1 and TR2 including the gate electrodes G1 and G2 of the first and second thin film transistors TR1 and TR2, which will be described later, may be disposed on the buffer layer 120.

The active layer A1 of the first thin film transistor TR1 and the active layer A2 of the second thin film transistor TR2 are disposed on the buffer layer 120.

The active layer A1 and the active layer A2 of the first thin film transistor TR1 and the second thin film transistor TR2 may be disposed to overlap the gate electrode G1 and G2, the first electrode S1 and S2, and the second electrode D1 and D2 of the first thin film transistor TR1 and the second thin film transistor TR2, respectively. Each of the active layer A1 and the active layer A2 of the first thin film transistor TR1 and the second thin film transistor TR2 includes the respective channel portion 131 and 231, the respective first conductor portion 133*a* and 233*a*, and the respective second conductor portion 133*b* and 233*b*, which are described in FIG. 1. The first conductor portions 133*a* and 233*a* are respectively disposed at one side of the channel portion 131 and 231, and the second conductor portions 133*b* and 233*b* are respectively disposed at the other side of the channel portion 131 and 231. The first conductor portions 133*a* and 233*a* and the second conductor portions 133*b* and 233*b* of the first thin film transistor TR1 and the second thin film transistor TR2 may be respectively defined as the active layer A1 and A2 which does not overlap the gate electrode G1 and G2. Also, the active layer A1 of the first thin film transistor TR1 further includes a first middle portion 132*a* between the channel portion 131 and the first conductor portion 133*a*, and the active layer A2 of the second thin film transistor TR2 further includes a second middle portion 132*b* between the channel portion 131 and the second conductor portion 133*b*.

A gate insulating film 140 is disposed on the active layer A1 of the first thin film transistor TR1, the active layer A2 of the second thin film transistor TR2 and the buffer layer 120 and is disposed between the active layer A1 of the first thin film transistor TR1 and the gate electrode G1 and between the active layer A2 of the second thin film transistor TR2 and the gate electrode G2, to thereby protect the active layer A1 of the first thin film transistor TR1 and the active layer A2 of the second thin film transistor TR2. The gate insulating film 140 may include a silicon nitride film SiNx or a silicon oxide film SiOx, but not limited thereto. The gate insulating film 140 may have a single-layered structure or a multi-layered structure.

A first capacitor electrode C11 of a storage capacitor C1 is disposed on the gate insulating film 140. The first capacitor electrode C11 may be connected to the first gate electrode G1 of the first thin film transistor TR1. The first capacitor electrode C11 may be integrated into the first gate electrode G1 of the first thin film transistor TR1 as one body.

The gate electrode G1 of the first thin film transistor TR1 and the gate electrode G2 of the second thin film transistor TR2 are disposed on the gate insulating film 140. The gate electrode G1 of the first thin film transistor TR1 and the gate electrode G2 of the second thin film transistor TR2 overlap the channel portions of the active layers A1 and A2.

The gate electrode G1 of the first thin film transistor TR1 and the gate electrode G2 of the second thin film transistor TR2 may include at least one of aluminum-based metal materials such as aluminum Al or aluminum alloys, silver-based metal materials such as silver Ag or silver alloys, copper-based metal materials such as copper Cu or copper alloys, molybdenum-based metal materials such as molybdenum Mo or molybdenum alloys, chromium Cr, tantalum Ta, neodymium Nd, and titanium Ti. Each of the gate electrode G1 of the first thin film transistor TR1 and the gate electrode G2 of the second thin film transistor TR2 may have a multi-layered structure including at least two conductive layers having the different physical properties.

An interlayer insulating film 160 is disposed on the gate electrode 150 and the gate insulating film 140.

The interlayer insulating film 160 include a silicon oxide film SiOx or a silicon nitride film SiNx, and may protect the thin film transistor. In order to contact the active layer A1 of the first thin film transistor TR1 and the active layer A2 of the second thin film transistor TR2 to source and drain electrodes, respectively, a portion of the interlayer insulating film 160 corresponding to a contact hole may be removed. A source electrode S1 and a drain electrode D1 of the first thin film transistor TR1 are disposed on the interlayer insulating film 160, and a source electrode S2 and a drain electrode D2 of the second thin film transistor TR2 are disposed on the interlayer insulating film 160. A data line DL, a driving power line PL, and a second capacitor electrode C12 of the storage capacitor C1 may be disposed on the interlayer insulating film 160.

A portion of the driving power line PL may extend and may be the drain electrode D1 of the first thin film transistor TR1. The drain electrode D1 of the first thin film transistor TR1 is connected to the active layer A1 through a first contact hole H1.

The source electrode S1 of the first thin film transistor TR1 is connected to the active layer A1 through a second contact hole H2, and may be connected to the light shielding layer 111 through a third contact hole H3.

The source electrode S1 of the first thin film transistor TR1 and the second capacitor electrode C12 are connected to each other. The source electrode S1 of the first thin film transistor TR1 and the second capacitor electrode C12 may be integrally formed as one body.

A portion of the data line DL may extend and may be the source electrode S2 of the second thin film transistor TR2. The source electrode S2 of the second thin film transistor TR2 may be connected to the active layer A2 through a fifth contact hole H5.

The drain electrode D2 of the second thin film transistor TR2 may be connected to the active layer A2 through a sixth contact hole H6, and may be connected to the first capacitor electrode C11 through a fourth contact hole H4, and may be connected to the light shielding layer 211 through a seventh contact hole H7.

A planarization layer 180 is disposed on the source electrode S1 and the first drain electrode D1 of the first thin film transistor TR1, the source electrode S2 and the second drain electrode D2 of the second thin film transistor TR2, the data line DL, the driving power line PL, and the second capacitor electrode C12.

The planarization layer 180 is formed of an insulating layer and is configured to planarize upper portions of the first thin film transistor TR1 and the second thin film transistor TR2, and to protect the first thin film transistor TR1 and the second thin film transistor TR2.

A first pixel electrode 711 of the display device 710 is disposed on the planarization layer 180. The first pixel electrode 711 contacts the second capacitor electrode C12 through an eighth contact hole H8 formed in the planarization layer 180. As a result, the first pixel electrode 711 may be connected to the source electrode S1 of the first thin film transistor TR1. The eighth contact hole H8 connected to the first pixel electrode 711 formed in the planarization layer 180 may be formed in a non-opening portion of the display device 710 while being overlapped with a bank layer 750.

The bank layer 750 is disposed at an edge of the first pixel electrode 711. The bank layer 750 defines a light emission area of the display device 710.

An organic light emitting layer 712 is disposed on the first pixel electrode 711, and a second pixel electrode 713 is disposed on the organic light emitting layer 712. Accordingly, the display device 710 is configured. The display device 710 shown in FIGS. 12 and 13 is an organic light emitting diode OLED. Accordingly, the display apparatus 500 according to another embodiment of the present disclosure is an organic light emitting display apparatus.

Figure 14:
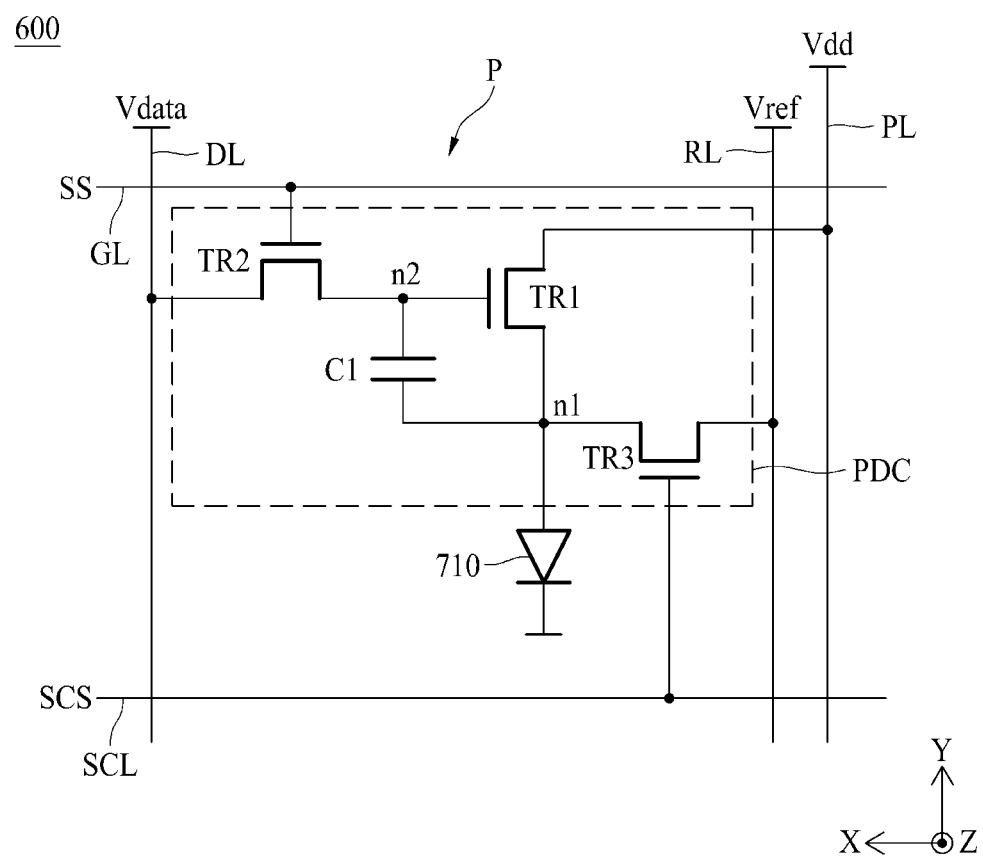
FIGS. 14 and 15 are circuit diagrams of any one pixel of a display apparatus according to another embodiment of the present disclosure.

FIG. 14 is a circuit diagram of any one pixel of a display apparatus according to another embodiment of the present disclosure.

The pixel P of the display apparatus 600 shown in FIG. 14 includes an organic light emitting diode OLED corresponding to a display device 710, and a pixel driver PDC for driving the display device 710. The display device 710 is connected to the pixel driver PDC.

In the pixel P, there are signal lines DL, GL, PL, RL, and SCL to supply a signal to the pixel driver PDC.

A data voltage Vdata is supplied to a data line DL, a scan signal SS is supplied to a gate line GL, a driving voltage Vdd for driving the pixel is supplied to a driving power line PL, a reference voltage Vref is supplied to a reference line RL, and a sensing control signal SCS is supplied to a sensing control line SCL.

For example, the pixel driver PDC includes a second thin film transistor TR2 (switching transistor) connected to the gate line GL and the data line DL, a first thin film transistor TR1 (driving transistor) for controlling a level of current output to the display device 710 according to the data voltage Vdata transmitted through the second thin film transistor TR2, and a third thin film transistor TR3 (reference transistor) for sensing the characteristics of the first thin film transistor TR1.

A storage capacitor C1 is disposed between a gate electrode of the first thin film transistor TR1 and the display device 710.

The second thin film transistor TR2 is turned on by the scan signal SS supplied to the gate line GL, and the turned-on second thin film transistor TR2 transmits the data voltage Vdata supplied to the data line DL to the gate electrode of the first thin film transistor TR1.

The third thin film transistor TR3 is connected to the reference line RL and a first node n1 between the first thin film transistor TR1 and the display device 710, and is turned on or off by the sensing control signal SCS, and senses the characteristics of the first thin film transistor TR1 corresponding to the driving transistor for a sensing period.

A second node n2 connected to the gate electrode of the first thin film transistor TR1 is connected to the second thin film transistor TR2. The storage capacitor C1 is formed between the second node n2 and the first node n1.

When the second thin film transistor TR2 is turned on, the data voltage Vdata supplied through the data line DL is supplied to the gate electrode of the first thin film transistor TR1. The data voltage Vdata is charged to the first capacitor C1 formed between the gate electrode and source electrode of the first thin film transistor TR1.

When the first thin film transistor TR1 is turned on, the current is supplied to the display device 710 through the first thin film transistor TR1 by the driving voltage Vdd for driving the pixel, whereby light is emitted from the display device 710.

Figure 15:
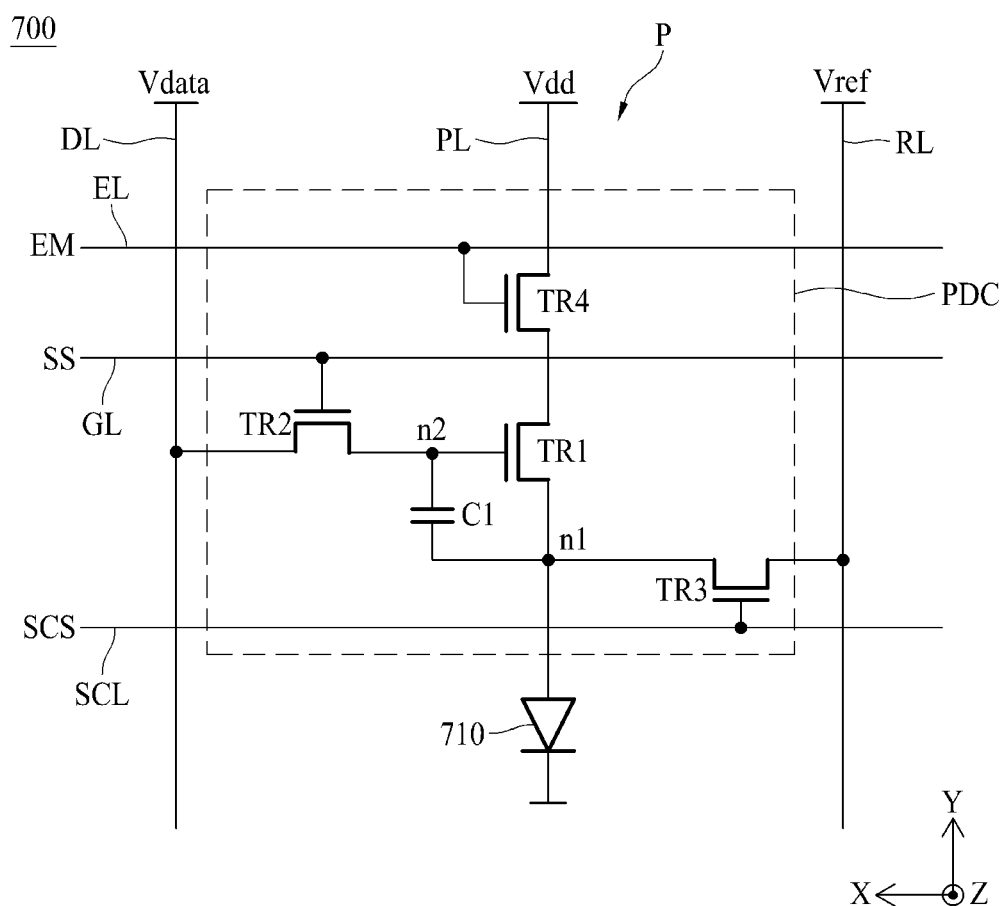

FIG. 15 is a circuit diagram of any one pixel of a display apparatus according to another embodiment of the present disclosure.

The pixel P of the display apparatus 700 shown in FIG. 15 includes an organic light emitting diode OLED corresponding to a display device 710, and a pixel driver PDC for driving the display device 710. The display device 710 is connected to the pixel driver PDC.

The pixel driver PDC includes thin film transistors TR1, TR2, TR3, and TR4.

In the pixel P, there are signal lines DL, EL, GL, PL, SCL, and RL to supply a driving signal to the pixel driver PDC.

In comparison to the pixel P of FIG. 14, the pixel P of FIG. 15 further includes an emission control line EL. An emission control signal EM is supplied to the emission control line EL.

Also, in comparison to the pixel driver PDC of FIG. 14, the pixel driver PDC of FIG. 15 further includes a fourth thin film transistor TR4, which is a light emitting control transistor for controlling an emission time point of the first thin film transistor TR1.

A storage capacitor C1 is disposed between a gate electrode of the first thin film transistor TR1 and the display device 710.

The second thin film transistor TR2 is turned on by a scan signal SS supplied to a gate line GL, and transmits a data voltage Vdata supplied to a data line DL to the gate electrode of the first thin film transistor TR1.

The third thin film transistor TR3 is connected to a reference line RL and is turned on or off by a sensing control signal SCS, and senses the characteristics of the first thin film transistor TR1 corresponding to a driving transistor for a sensing period.

The fourth thin film transistor TR4 transfers a driving voltage Vdd to the first thin film transistor TR1 or blocks the driving voltage Vdd according to the emission control signal EM. When the fourth thin film transistor TR4 is turned on, a current is supplied to the first thin film transistor TR1, whereby light is emitted from the display device 710.

The pixel driver PDC according to another embodiment of the present disclosure may be formed in various structures in addition to the above-described structures. For example, the pixel driver PDC may include five or more thin film transistors.

Accordingly, in the thin film transistor array according to one embodiment of the present disclosure, the conductor portions of the plurality of transistors provided on the same plan may have the different resistances.

Also, the thin film transistor array according to one embodiment of the present disclosure may reduce short channel effects generated in a thin film transistor having a short channel length such as a hot carrier stress HCS, a threshold voltage roll-off phenomenon, and a threshold voltage required in an individual thin film transistor for a plurality of thin film transistors provided on the same plan, and may optimize the electrical characteristics such as mobility and on-current.

Furthermore, in the thin film transistor array according to one embodiment of the present disclosure, the active layers of the plurality of transistors provided on the same plan may have the different dopant concentrations.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A thin film transistor array comprising:
  a substrate;
  a first thin film transistor on the substrate, the first thin film transistor including a first active layer on the substrate comprising a first oxide semiconductor, the first active layer comprising a first channel portion, a first conductor portion, and a first middle portion between the first channel portion and the first conductor portion; and
  a second thin film transistor on the substrate, the second thin film transistor including a second active layer on the substrate comprising a second oxide semiconductor, the second active layer comprising a second channel portion, a second conductor portion, and a second middle portion between the second channel portion and the second conductor portion,
  wherein a resistivity of the first conductor portion of the first thin film transistor is greater than a resistivity of the second conductor portion of the second thin film transistor,
  wherein the first conductor portion and the first middle portion of the first active layer of the first thin film transistor include a dopant, and the second conductor portion and the second middle portion of the second active layer of the second thin film transistor include the dopant, and
  wherein the first conductor portion of the first thin film transistor has a first doping concentration of the dopant, and the first channel portion has a second doping concentration of the dopant that is less than the first doping concentration, and
  the second conductor portion of the second thin film transistor has a third doping concentration of the dopant, and the second channel portion has a fourth doping concentration of the dopant that is less than the third doping concentration.

2. The thin film transistor array according to claim 1, wherein the first thin film transistor further includes a first gate electrode that is spaced apart from the first active layer and overlaps the first channel portion without overlapping the first conductor portion, and
  the second thin film transistor further includes a second gate electrode that is spaced apart from the second active layer and overlaps the second channel portion without overlapping the second conductor portion.

3. The thin film transistor array according to claim 2, wherein the first gate electrode overlaps the first middle portion of the first thin film transistor, and the second gate electrode overlaps the second middle portion of the second thin film transistor.

4. The thin film transistor array according to claim 1, wherein a length of the first middle portion of the first thin film transistor is less than a length of the second middle portion of the second thin film transistor.

5. The thin film transistor array according to claim 1, wherein a doping concentration of the first middle portion of the first thin film transistor varies from the second doping concentration to the first doping concentration in a direction from the first channel portion towards the first conductor portion, and a doping concentration of the second middle portion of the second thin film transistor varies from the fourth doping concentration to the third doping concentration in a direction from the second channel portion towards the second conductor portion.

6. The thin film transistor array according to claim 5, wherein the doping concentration of the first middle portion is less than the doping concentration of the second middle portion.

7. The thin film transistor array according to claim 1, wherein the first doping concentration of the first conductor portion is less than the second doping concentration of the second conductor portion.

8. The thin film transistor array according to claim 1, wherein the dopant includes at least one of boron, phosphorus, fluorine, or hydrogen.

9. The thin film transistor array according to claim 1, wherein a dopant concentration of the first conductor portion of the first thin film transistor is 0.01% to 0.8%.

10. The thin film transistor array according to claim 1, wherein a dopant concentration of the second conductor portion of the second thin film transistor is 0.1% to 0.8%.

11. A display apparatus including the thin film transistor array of claim 1 and a light emitting element connected to the thin film transistor array.

12. A thin film transistor array comprising:
a substrate;
a first oxide semiconductor thin film transistor on the substrate, the first oxide semiconductor thin film transistor including a first active layer having a first channel portion, a first conductor portion, and a first middle portion between the first channel portion and the first conductor portion; and
a second oxide semiconductor thin film transistor on the substrate, the second oxide semiconductor thin film transistor including a second active layer having a second channel portion, a second conductor portion, and a second middle portion between the second channel portion and the second conductor portion,
wherein a length of the first channel portion of the first oxide semiconductor thin film transistor is greater than a length of the second channel portion of the second oxide semiconductor thin film transistor, and a length of the first middle portion of the first oxide semiconductor thin film transistor is less than a length of the second middle portion of the second oxide semiconductor thin film transistor,
wherein the first conductor portion and the first middle portion of the first active layer of the first oxide semiconductor thin film transistor include a dopant, and the second conductor portion and the second middle portion of the second active layer of the second oxide semiconductor thin film transistor include the dopant, and
wherein the first conductor portion of the first oxide semiconductor thin film transistor has a first doping concentration of the dopant, and the first channel portion has a second doping concentration of the dopant that is less than the first doping concentration, and
the second conductor portion of the second oxide semiconductor thin film transistor has a third doping concentration of the dopant, and the second channel portion has a fourth doping concentration of the dopant that is less than the third doping concentration.

13. The thin film transistor array according to claim 12, wherein a resistivity of the first conductor portion of the first oxide semiconductor thin film transistor is greater than a resistivity of the second conductor portion of the second oxide semiconductor thin film transistor.

* * * * *